(12) United States Patent
Hamada et al.

(10) Patent No.: US 10,840,469 B2
(45) Date of Patent: Nov. 17, 2020

(54) OLED DISPLAY DEVICE AND MANUFACTURING METHOD THEREOF

(71) Applicant: Tianma Japan, Ltd., Kanagawa (JP)

(72) Inventors: Keita Hamada, Kanagawa (JP); Hiroshi Tanabe, Kanagawa (JP)

(73) Assignees: XIAMEN TIANMA MICRO-ELECTRONICS CO., LTD., Xiamen (CN); TIANMA JAPAN, LTD., Kanagawa (JP)

( * ) Notice: Subject to any disclaimer, the term of this patent is extended or adjusted under 35 U.S.C. 154(b) by 21 days.

(21) Appl. No.: 16/150,499

(22) Filed: Oct. 3, 2018

(65) Prior Publication Data

US 2019/0103573 A1   Apr. 4, 2019

(30) Foreign Application Priority Data

Oct. 3, 2017 (JP) .................................. 2017-193743
May 25, 2018 (JP) .................................. 2018-100704

(51) Int. Cl.

| H01L 27/32 | (2006.01) |
| H01L 51/50 | (2006.01) |
| H01L 51/52 | (2006.01) |
| H01L 51/56 | (2006.01) |

(52) U.S. Cl.
CPC ...... H01L 51/5012 (2013.01); H01L 27/3211 (2013.01); H01L 27/3246 (2013.01); H01L 51/5056 (2013.01); H01L 51/5072 (2013.01); H01L 51/5088 (2013.01); H01L 51/5092 (2013.01); H01L 51/5206 (2013.01); H01L 51/5246 (2013.01); H01L 27/3283 (2013.01); H01L 51/5221 (2013.01); H01L 51/56 (2013.01)

(58) Field of Classification Search
CPC ............... G06F 1/1641; H01L 27/3246; H01L 51/0097; H01L 51/5265; H01L 51/5048–5096
See application file for complete search history.

(56) References Cited

U.S. PATENT DOCUMENTS

| 2013/0248867 A1 | 9/2013 | Kim et al. |
| 2015/0372063 A1* | 12/2015 | Lee ..................... H01L 27/3246 257/40 |
| 2016/0155785 A1 | 6/2016 | Sato |

(Continued)

FOREIGN PATENT DOCUMENTS

JP    2016-103395    6/2016

*Primary Examiner* — Eric A. Ward
(74) *Attorney, Agent, or Firm* — Nixon & Vanderhye

(57) ABSTRACT

Each of subpixels includes: an upper electrode; a lower electrode; an organic light-emitting layer sandwiched between the upper electrode and the lower electrode; and a lower carrier supply layer sandwiched between the lower electrode and the organic light-emitting layer. The lower carrier supply layer is configured to: make contact with the lower electrode and the organic light-emitting layer, respectively; supply carriers from the lower electrode to the organic light-emitting layer; cover the lower electrode entirely in an opening of the pixel defining layer; and have an edge at a top surface of the pixel defining layer surrounding the lower electrode. The organic light-emitting layer covers an entire surface of the lower carrier supply layer including the edge of the lower carrier supply layer.

10 Claims, 24 Drawing Sheets

(56) References Cited

U.S. PATENT DOCUMENTS

| | | | |
|---|---|---|---|
| 2016/0380035 A1* | 12/2016 | Cho | H01L 51/5056 |
| | | | 257/40 |
| 2017/0069695 A1* | 3/2017 | Choung | H01L 51/5228 |
| 2017/0317316 A1* | 11/2017 | Yang | H01L 51/006 |
| 2017/0365812 A1* | 12/2017 | Choung | H01L 51/0016 |
| 2018/0190732 A1* | 7/2018 | Lee | H01L 27/3246 |
| 2018/0301519 A1* | 10/2018 | Ma | H01L 27/3248 |

* cited by examiner

US 10,840,469 B2

OLED DISPLAY DEVICE AND MANUFACTURING METHOD THEREOF

CROSS-REFERENCE TO RELATED APPLICATIONS

The present application claims priority from Japanese patent application JP2017-193743 filed on Oct. 3, 2017 and Japanese patent application JP2018-100704 filed on May 25, 2018, the contents of which are hereby incorporated by reference into this application.

BACKGROUND

The present disclosure is related to an OLED (organic light-emitting diode) display device and manufacturing method thereof.

The OLED element is a light-emitting element driven by an electric current, which does not requires a back light, and because of the benefits such as low power consumption, wider viewing angle, and high contrast ratio, the OLED element is drawing attention in the development of flat display panels. A typical OLED display device includes a plurality of subpixels arranged in an matrix. Each of the subpixels has an organic light-emitting layer that emits light of blue, red, or green, and a cathode and an anode that sandwich the organic light-emitting layer. For example, US2013/0248867A and JP2016-103395A describe configuration example of an OLED display device.

SUMMARY

An OLED display device according to an aspect of the present disclosure includes: a plurality of subpixels arranged on a surface of a substrate; and a pixel defining layer surrounding a light-emitting region of each of the plurality of subpixels. Each of the plurality of subpixels includes: an upper electrode; a lower electrode; an organic light-emitting layer sandwiched between the upper electrode and the lower electrode; and a lower carrier supply layer sandwiched between the lower electrode and the organic light-emitting layer. The lower carrier supply layer is configured to: make contact with the lower electrode and the organic light-emitting layer, respectively; supply carriers from the lower electrode to the organic light-emitting layer; cover the lower electrode entirely in an opening of the pixel defining layer; and have an edge at a top surface of the pixel defining layer surrounding the lower electrode. The organic light-emitting layer covers an entire surface of the lower carrier supply layer including the edge of the lower carrier supply layer.

It is to be understood that both the foregoing general description and the following detailed description are exemplary and explanatory and are not restrictive of this disclosure.

DETAILED DESCRIPTION OF THE EMBODIMENT

Figure 1:
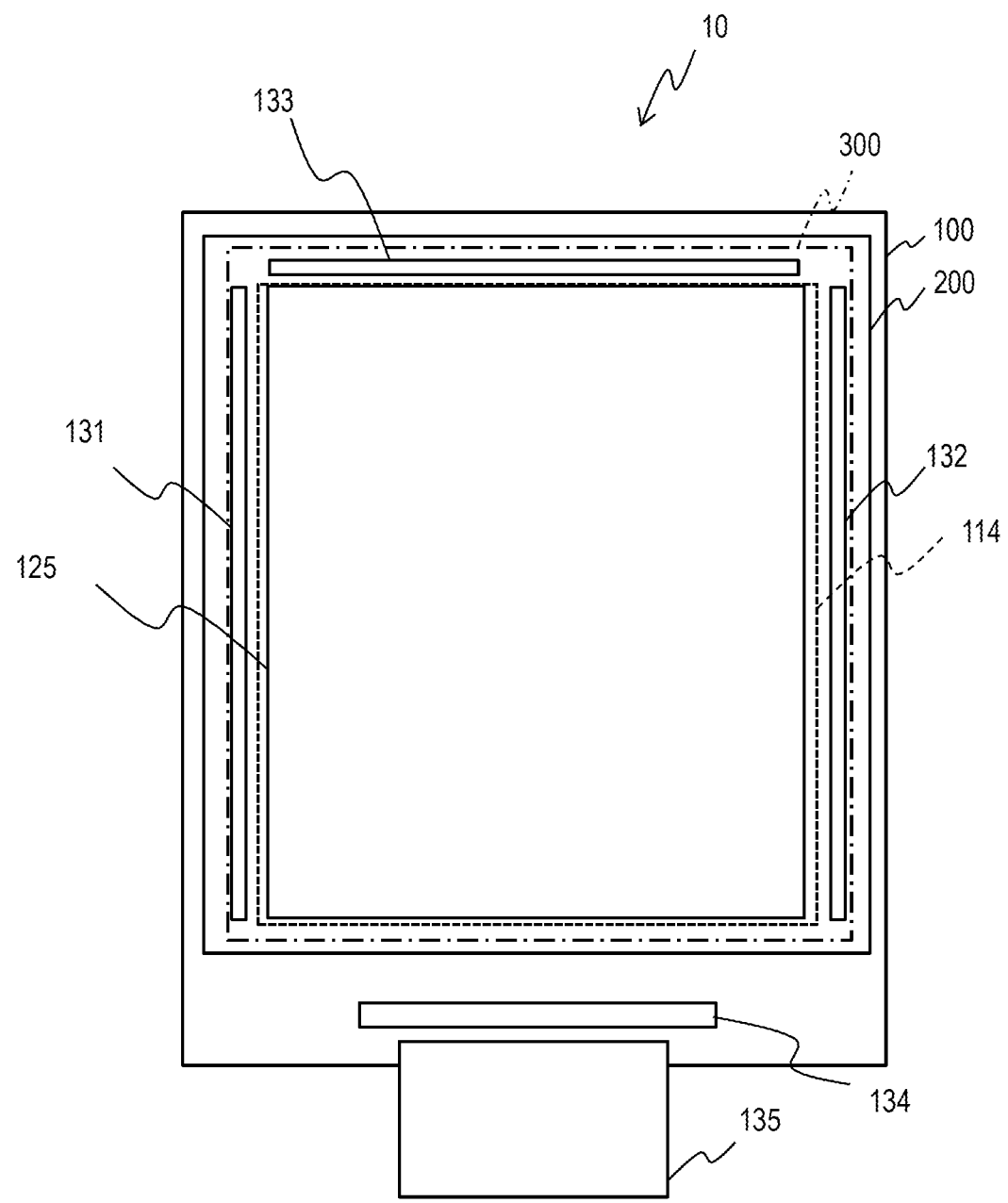
FIG. 1 is a schematic diagram illustrating a configuration example of an OLED display device of this embodiment.

Below, the configuration and manufacturing method of OLED (organic light-emitting diode) will be disclosed. The inventors of the OLED display device described in the embodiments below have conducted a study where only blue subpixels are driven in an OLED display panel, and discovered that red and green subpixels, which are not supposed to emit light in this case, sometimes emit weak light. This unintended light-emission of the subpixels would cause degradation of color purity of the displayed image, or abnormal display in lower gradation, in particular. Thus, it is desirable to prevent the unintended light-emission of the subpixels.

The study conducted by the inventors revealed that when a carrier supply layer having carrier mobility is formed over the entire display region between the electrode and organic light-emitting layer in subpixels of the OLED display panel, the unintended light-emission of subpixels occur. The carrier supply layer is a hole supply layer including a hole injection layer and/or hole transport layer, for example.

When different voltages are applied to respective adjacent subpixels, carrier leak occurs between the adjacent subpixels via the carrier supply layer. For example, when only blue subpixels are driven, a small fraction of the electric current applied to the blue subpixels flows to the red and green adjacent subpixels that are not intended to emit light through the carrier supply layer. This path for the small current is also referred to as a leak path.

This small current drives the adjacent subpixels of red and green to emit weak light (crosstalk). This phenomenon is more noticeable when the distance between adjacent subpixels is smaller, and is particularly noticeable in the case of low gradation display. Therefore, in the embodiments described below, the structure of the OLED display device that reduces or eliminates the leak path in order to suppress this carrier leak will be explained.

In the OLED display device described below, the lower carrier supply layer supplying the carrier from the lower electrode to the organic light-emitting layer covers the entire surface of the lower electrode in the opening of the pixel defining layer, and an edge of the lower carrier supply layer comes on the top surface of the pixel defining layer surrounding the lower electrode. The organic light-emitting layer covers an entire surface of the lower carrier supply layer including the edge of the lower carrier supply layer. This way, the leak path in the lower carrier supply layer between adjacent subpixels is reduced or eliminated, and the carrier leak between adjacent subpixels of different colors is prevented.

Below, embodiments of the present disclosure will be explained in detail with reference to the appended figures. Embodiments of the present disclosure are mere examples to implement the present disclosure, and shall not be interpreted to limit the technical scope of the present disclosure. In the respective figures, the same configurations are given the same reference characters. For ease of explanation, the dimensions and shapes of the illustrated parts and configurations are not necessarily true.

Embodiment 1

[Device Configuration]

FIG. 1 is a schematic diagram illustrating a configuration example of an OLED display device 10 of this embodiment. The OLED display device 10 includes a TFT (Thin Film Transistor) substrate 100 on which OLED elements are formed, a sealing substrate 200 for sealing the OLED elements, and a bonding part 300 that bonds the TFT substrate 100 and the sealing substrate 200 (glass frit seal part). Nitrogen is sealed between the TFT substrate 100 and sealing substrate 200, for example, and sealed by the bonding part 300.

A scan driver 131, an emission driver 132, a protection circuit 133, and a driver IC 134 are disposed around a cathode electrode forming area 114 outside a display region 125 of the TFT substrate 100. Those components are connected to external devices via FPC (flexible printed circuit) 135.

The scan driver 131 drives scan lines of the TFT substrate 100. The emission driver 132 drives emission control lines to control the light-emitting periods of the respective subpixels. The driver IC 134 is mounted using an anisotropic conductive film (ACF), for example.

The driver IC 134 provides the scan driver 131 and emission driver 132 with power source voltage and timing signal (control signal), and provides data lines with data voltage corresponding image data. That is, the driver IC 134 has the display control function.

The sealing substrate 200 is a transparent insulating substrate, which is a glass substrate, for example. A λ/4-order retardation plate and a polarizing plate are disposed on the light-emitting surface (front surface) of the sealing substrate 200 to suppress reflection of light incident from the outside.

Figure 2A:
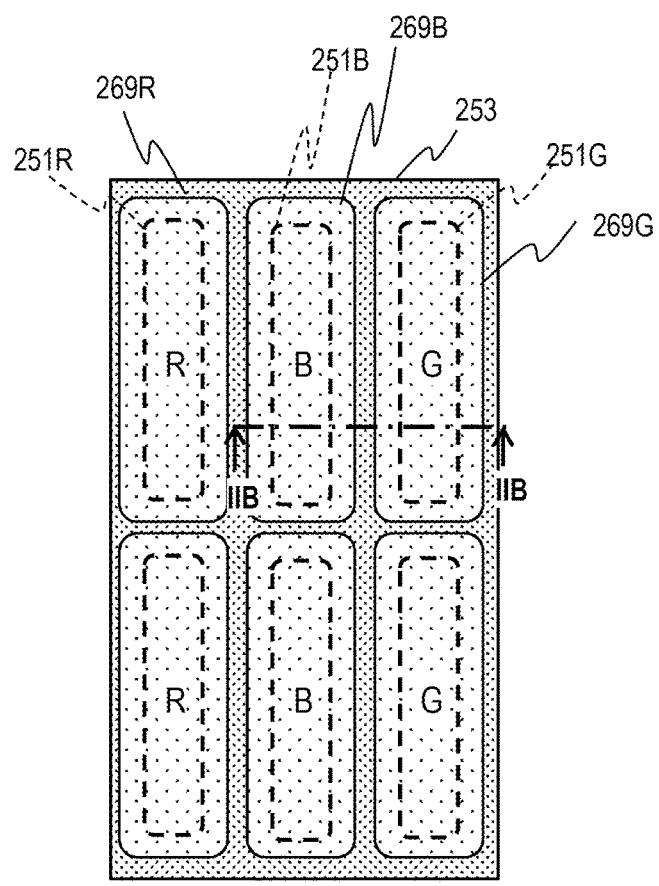
FIG. 2A is a plan view of a part of the display region.

FIG. 2A is a plan view of a part of the display region 125. FIG. 2A illustrates a plurality of subpixels arranged in a matrix. At least three subpixels are configured to emit first to third colors respectively. An example of the first color is blue, an example of the second color is red, and an example of the third color is green. FIG. 2A illustrates red subpixels (light-emitting region) 251R, blue subpixels (light-emitting region) 251B, and green subpixels (light-emitting region) 251G. Among the subpixels in FIG. 2A, one red subpixel, one blue subpixel, and one green subpixel are denoted with the reference characters, respectively. Each of the subpixels emits red, blue, or green. Red, blue, and green subpixels constitute one pixel (main pixel).

In the example of FIG. 2A, the red subpixel 251R, the blue subpixel 251B, and the green subpixel 251G are arranged cyclically in the row direction (right and left direction in FIG. 2A). In the example of FIG. 2A, the subpixels (light-emitting regions) of different colors are configured such that the red subpixel 251R, the blue subpixel 251B, and the green subpixel 251G are arranged in this order from the left to the right. In the column direction (top and bottom direction in FIG. 2A), the subpixels of the same color are lined up. The order of the subpixels is not limited to red, blue, and green, and the subpixels may be arranged in the order of red, green, and blue, for example.

Each subpixel (light-emitting region) is surrounded by an insulating pixel defining layer 253. The pixel defining layer 253 defines each subpixel (light-emitting region). The subpixel (light-emitting region) is formed in each opening of the pixel defining layer 253.

Each subpixel (light-emitting region) is covered by the organic light-emitting layer of the same color. More specifically, the red subpixel 251R, the blue subpixel 251B, and the green subpixel 251G are completely covered with the red organic light emitting layer 269R, the blue organic light emitting layer 269B, and the green organic light emitting layer 269G, respectively. Among the organic light-emitting layers in FIG. 2A, one red organic light-emitting layer, one blue organic light-emitting layer, and one green organic light-emitting layer are denoted with the reference characters.

Figure 2B:
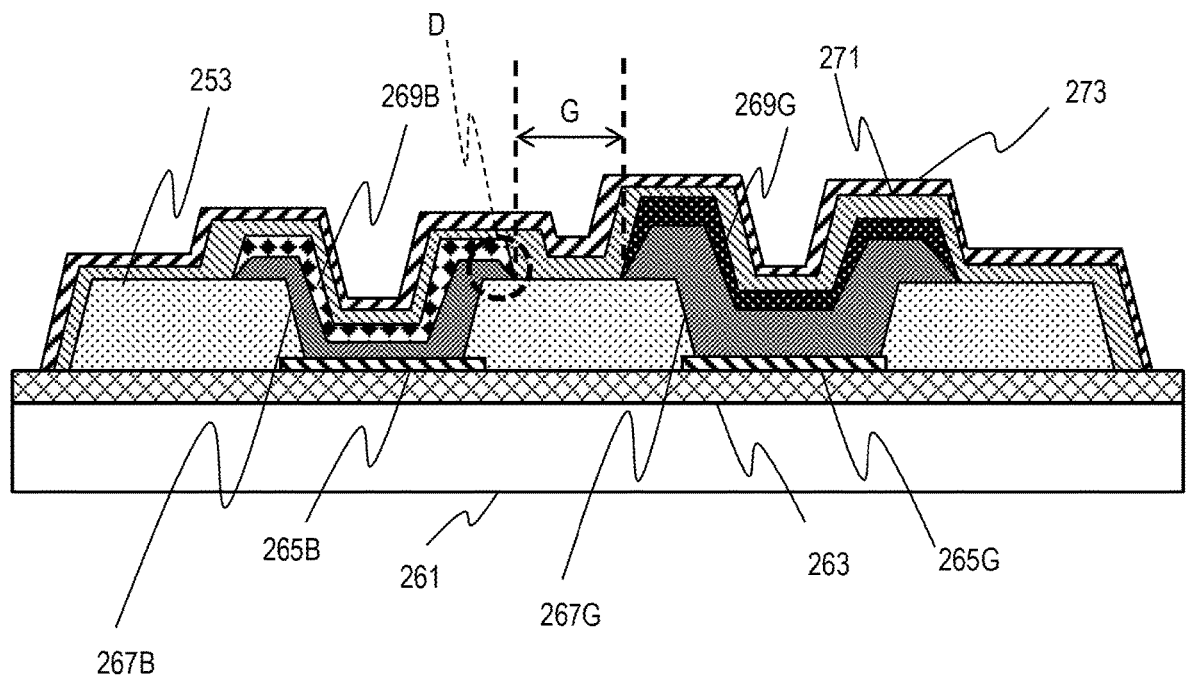
FIG. 2B is a cross-sectional view taken along the line IIB-IIB in FIG. 2A.

FIG. 2B is a cross-sectional view taken along the line IIB-IIB in FIG. 2A. The OLED display device 10 includes the TFT substrate 100 and the sealing substrate (transparent substrate) 200 facing the TFT substrate 100. FIG. 2B is a schematic diagram of the cross-sectional structure of the TFT substrate 100.

The OLED display device 10 includes a TFT circuit layer 263 and a plurality of lower electrodes (anode electrodes 265B, 265G, for example) disposed above an insulating substrate 261, and the plurality of lower electrodes are separated from each other. Those separated lower electrodes are part of a lower electrode layer. The OLED display device 10 further includes an upper electrode (layer) (a cathode electrode (layer) 273, for example), and a plurality of organic light-emitting layers 269B and 269G. Each layer may be constituted of one continuous portion or a plurality of separated portions formed simultaneously. In the descriptions below, part of a layer may be referred to as the layer.

The insulating substrate 261 is formed of glass or resin, for example, and is an inflexible or flexible substrate. The side closer to the insulating substrate 261 is the lower side, and the side further from the insulating substrate 261 is the upper side. A cap layer, which is not shown in the figure, may also be formed on the cathode electrode (upper electrode) 273.

The anode electrodes 265B and 265G are the anode electrodes of the blue subpixel 251B and the green subpixel 251G, respectively. The cathode electrode 273 is a transparent electrode that transmits part or all of the visible light from the organic light-emitting layers toward the sealing structure part, and is commonly used by all subpixels.

Each light-emitting layer is arranged between the cathode electrode and one anode electrode. The plurality of anode electrodes are disposed on the surface of the TFT circuit layer 263 (for example, on the planarization film), and one organic light emitting layer is disposed on one anode electrode.

The TFT circuit layer 263 includes a plurality of subpixel circuits (will simply be referred to as pixel circuits below) each including a plurality of TFTs. Each of the pixel circuits is formed between the insulating substrate 261 and the anode electrode, and controls an electric current supplied to each anode electrode. The anode electrode is connected to the pixel circuit by a contact portion formed in a contact hole of the planarization film.

The pixel circuit may have any appropriate configuration. An example of the pixel circuit includes, for example, a switch TFT for selecting a subpixel, a driving TFT for an OLED element, a switch TFT for controlling supply and stop of a driving current to the OLED element, and a holding capacitance.

In FIG. 2B, the light-emitting layer 269B is arranged between the cathode electrode 273 and the anode electrode 265B. The light-emitting layer 269G is arranged between the cathode electrode 273 and the anode electrode 265G. In the example of FIG. 2B, the organic light-emitting layers are formed for respective different colors.

The hole supply layer is arranged between the anode electrode and the organic light-emitting layer. The hole supply layer is in contact with the anode electrode and the organic light-emitting layer, respectively, and forms the interfaces. The hole supply layer is constituted of a hole injection layer and a hole transport layer, or one layer that has the functions of those layers. The hole supply layer is also referred to as a lower carrier supply layer. In FIG. 2B, the hole supply layer of a subpixel is separated from the hole supply layers of the adjacent subpixels of different colors.

For example, the hole supply layer 267B is arranged between the anode electrode 265B and the organic light-emitting layer 269B, and the hole supply layer 267G is arranged between the anode electrode 265G and the organic light-emitting layer 269G. The hole supply layers 267B and 267G are separated from each other.

The electron supply layer is arranged between the cathode electrode and the organic light-emitting layer. The electron supply layer is in contact with the cathode electrode and the organic light-emitting layer, respectively, and form the interfaces. In FIG. 2B, the electron supply layer 271 of each subpixel is part of one layer commonly used for the respective subpixels. The electron supply layer 271 is disposed between the cathode electrode 273 and the organic light-emitting layer 269B, and between the cathode electrode 273 and the organic light emitting layer 269G. The electron supply layer 271 is constituted of an electron injection layer and an electron transport layer, or one layer that has the functions of those layers. The electron supply layer 271 is also referred to as an upper carrier supply layer.

One OLED element includes an anode electrode, which is a lower electrode, a hole supply layer, an organic light-emitting layer, an electron supply layer, and a cathode electrode, which is an upper electrode, in the opening of the pixel defining layer 253.

The pixel defining layer is formed between the anode electrode and the hole supply layer. In FIG. 2B, the pixel defining layer 253 is formed between the anode electrodes 265B and 265G and the hole supply layers 267B and 267G. The pixel defining layer 253 includes the side faces inside of the respective openings where the subpixels are formed and the top surfaces between respective openings. In the example of FIG. 2B, the top surface is flat.

As illustrated in FIG. 2B, the hole supply layer 267B is formed on the anode electrode 265B and the pixel defining layer 253 so as to make contact therewith. Similarly, the hole supply layer 267G is formed on the anode electrode 265G and the pixel defining layer 253 so as to make contact therewith.

Figure 2C:
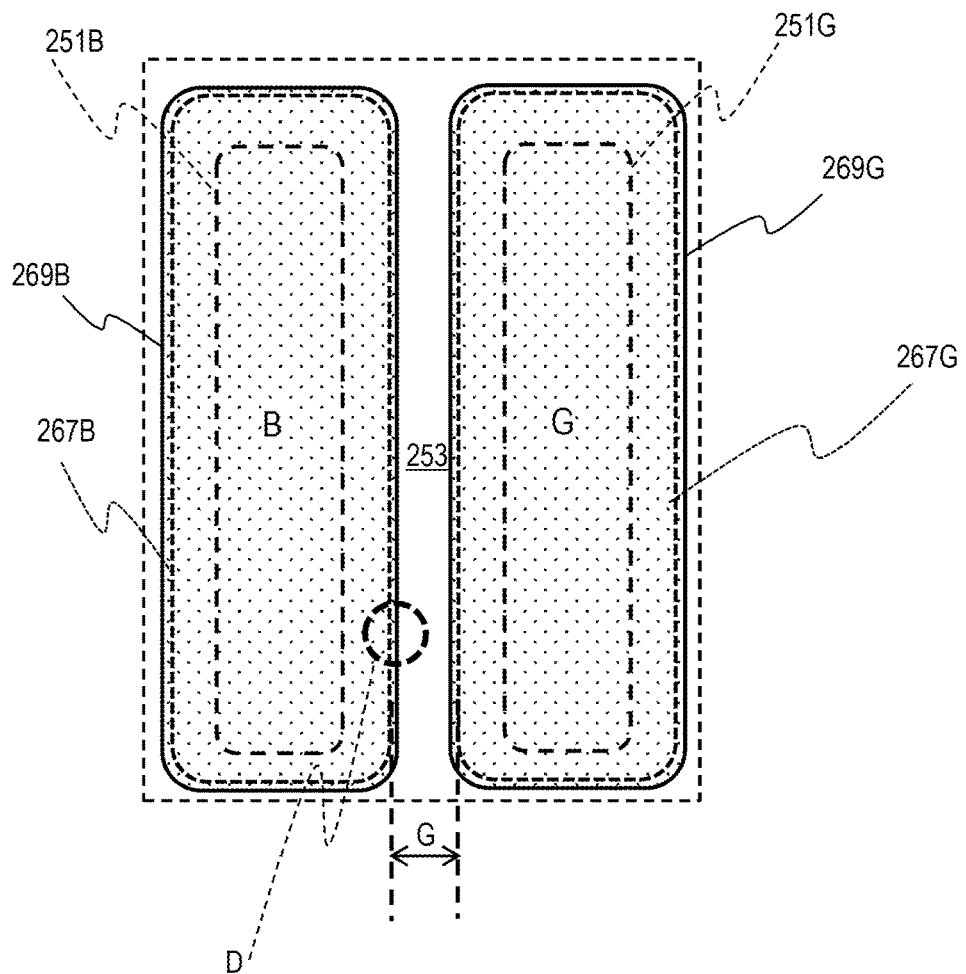
FIG. 2C illustrates the positional relationship between the subpixels, the hole supply layers, and the organic light-emitting layers.

FIG. 2C illustrates the positional relationship between the subpixels (openings of the pixel defining layer), the hole supply layers, and the organic light-emitting layers. As illustrated in FIGS. 2B and 2C, the hole supply layer 267B is formed so as to cover part of the top surface of the pixel defining layer 253 that surrounds the hole supply layer 267B. That is, the hole supply layer 267B is formed only on a part of the top surface, and an edge of the hole supply layer 267B is located on the top surface of the pixel defining layer 253.

Similarly, the hole supply layer 267G is formed so as to cover part of the top surface of the pixel defining layer 253 that surrounds the hole supply layer 267B. That is, the hole supply layer 267G is formed only on a part of the top surface, and an edge of the hole supply layer 267G is located on the top surface of the pixel defining layer 253.

The hole supply layer 267B and the hole supply layer 267G are separated from each other in the in-plane direction (direction in the main surface of the insulating substrate 261), and a gap exists between the two. Specifically, on the pixel defining layer 253, the edge of the hole supply layer 267B is separated from the edge of the hole supply layer 267G, and a gap G exists between the two. In this example, the hole supply layer of each subpixel is separated from the hole supply layer of the adjacent subpixels of different colors. In this example, the hole supply layers of the respective adjacent subpixels are all separated from each other, but if the color is the same, the hole supply layers of adjacent subpixels do not have to have a gap therebetween.

The hole supply layer of each subpixel has an appropriate thickness due to the micro-cavity structure. In FIG. 2B, the hole supply layer 267G for the green subpixel is thicker than the hole supply layer 267B for the blue subpixel.

The organic light-emitting layer 269B is formed immediately above the hole supply layer 267B or on the hole supply layer 267B so as to make contact with the hole supply layer 267B and form an interface. Similarly, the organic light-emitting layer 269G is formed immediately above the hole supply layer 267G or on the hole supply layer 267G so as to make contact with the hole supply layer 267G and form an interface. The organic light-emitting layer 269B covers the entire surface including the entire outer peripheral edge of the hole supply layer 267B. Similarly, the organic light-emitting layer 269G covers the entire surface including the entire outer peripheral edge of the hole supply layer 267G.

Figure 2D:
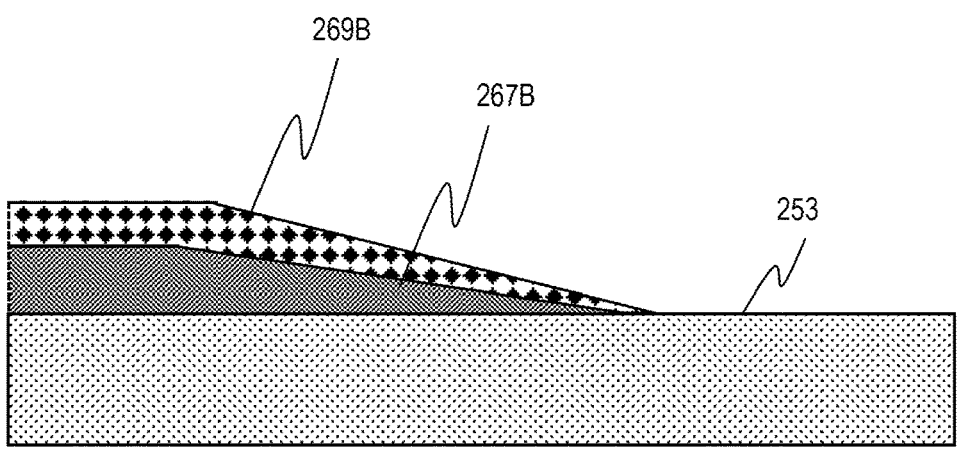
FIG. 2D is an enlarged view of the portion enclosed by the broken line D in FIG. 2B.

FIG. 2D is an enlarged view of the portion enclosed by the broken line D in FIG. 2B. The position of the broken line D in a plan view is denoted with the reference character D of FIG. 2C. FIG. 2D illustrates the edge portions of the hole supply layer 267B and the organic light-emitting layer 269B. FIG. 2D illustrates the pixel defining layer 253, the hole supply layer 267B on the pixel defining layer 253, and the organic light-emitting layer 269B on the hole supply layer 267B. The organic light-emitting layer 269B completely covers the hole supply layer 267B, and the hole supply layer 267B is not exposed from the organic light-emitting layer 269B at all. The outer edge of the organic light-emitting layer 269B is located on the top surface of the pixel defining layer 253, and covers the outer edge of the hole supply layer 267B.

As illustrated in FIGS. 2B and 2C, it is preferable that the organic light-emitting layer 269G completely cover the hole supply layer 267G, and the hole supply layer 267G be not exposed from the organic light-emitting layer 269G at all. The outer edge of the organic light-emitting layer 269G is located on the top surface of the pixel defining layer 253, and covers the outer edge of the hole supply layer 267G.

In FIGS. 2B and 2C, the edge of the organic light-emitting layer is located between the edge of the hole supply layer covered by the organic light-emitting layer and the edge of the hole supply layer of an adjacent subpixel of a different color. For example, the edge of the blue organic light-emitting layer 269B is located between the edge of the hole supply layer 267B of the blue subpixel and the hole supply layer 267G of the green subpixel. Similarly, the edge of the green organic light-emitting layer 269G is located between the edge of the hole supply layer 267G of the green subpixel and the hole supply layer 267B of the blue subpixel.

The substantial leak path for the carrier leak between the subpixels of different colors is formed in the hole supply layer. Because the hole supply layers of the subpixels of different colors are separated from each other, the carrier leak between the subpixels of different colors can be reduced. The hole supply layers of the subpixels of different colors are separated from each other, and the electron supply layer is formed at the gap therebetween. The organic light-emitting layer covers the entire surface of the hole supply layer including the edge of the hole supply layer between the subpixels of different colors.

Thus, the hole supply layers of the subpixels of different colors do not make direct contact with the electron supply layer. Even if the carrier mobility of the hole supply layer is about the same as that of the organic light-emitting layer, although holes move easily from the hole supply layer to the organic light-emitting layer, holes do not move from the organic light-emitting layer to the hole supply layer because of a large energy barrier against the holes. That is, it is possible to suppress the formation of a leak path from the hole supply layer of the first color subpixel to the hole supply layer of the second color subpixel via the organic light-emitting layer of the first color subpixel, the electron supply layer, and the organic light-emitting layer of the second color subpixel. Thus, it is possible to suppress the carrier leak between the subpixels of different colors more effectively.

As illustrated in FIG. 2A, the organic light-emitting layer of each subpixel is separated from the organic light-emitting layer of an adjacent subpixel. For example, in FIG. 2B, the edge of the blue organic light-emitting layer 269B is separated from the edge of the green organic light-emitting layer 269G in the in-plane direction, and a gap exists therebetween.

The electron supply layer 271 is formed on the organic light-emitting layers 269B and 269G so as to make contact with the organic light-emitting layers 269B and 269G. The electron supply layer 271 is a layer commonly used for all of the subpixels. In the example of FIG. 2B, the electron supply layer 271 does not have a break on the pixel defining layer 253, and is continuously formed over the two subpixels 251G and 251B. The electron supply layer 271 may be formed for each color of the subpixels.

On the electron supply layer 271, the cathode electrode 273 is formed so as to be in contact with the electron supply layer 271. The cathode electrode 273 is a layer commonly used for all of the subpixels. In the example of FIG. 2B, the cathode electrode 273 does not have a break on the pixel defining layer 253, and is continuously formed over the two subpixels 251G and 251B.

FIGS. 2B, 2C, and 2D illustrate the structure between and in the vicinity of the blue subpixel 251B and the green subpixel 251G. The descriptions above with reference to FIGS. 2B, 2C, and 2D are applied to the relationship between the hole supply layer 267R and the organic light-emitting layer 269R of the red subpixel and between the red subpixel 251R and the subpixels 251B and 251G of the other colors.

Before explaining one example of the manufacturing method of the OLED display device 10 in this embodiment, the vapor deposition of the organic materials such as the hole supply layer using a metal mask in this embodiment will be explained briefly with reference to FIGS. 3A to 3C and FIGS. 4A to 4C. The description below is also applied to a light-emitting material, for example, as long as it is an organic material.

Figure 3A:
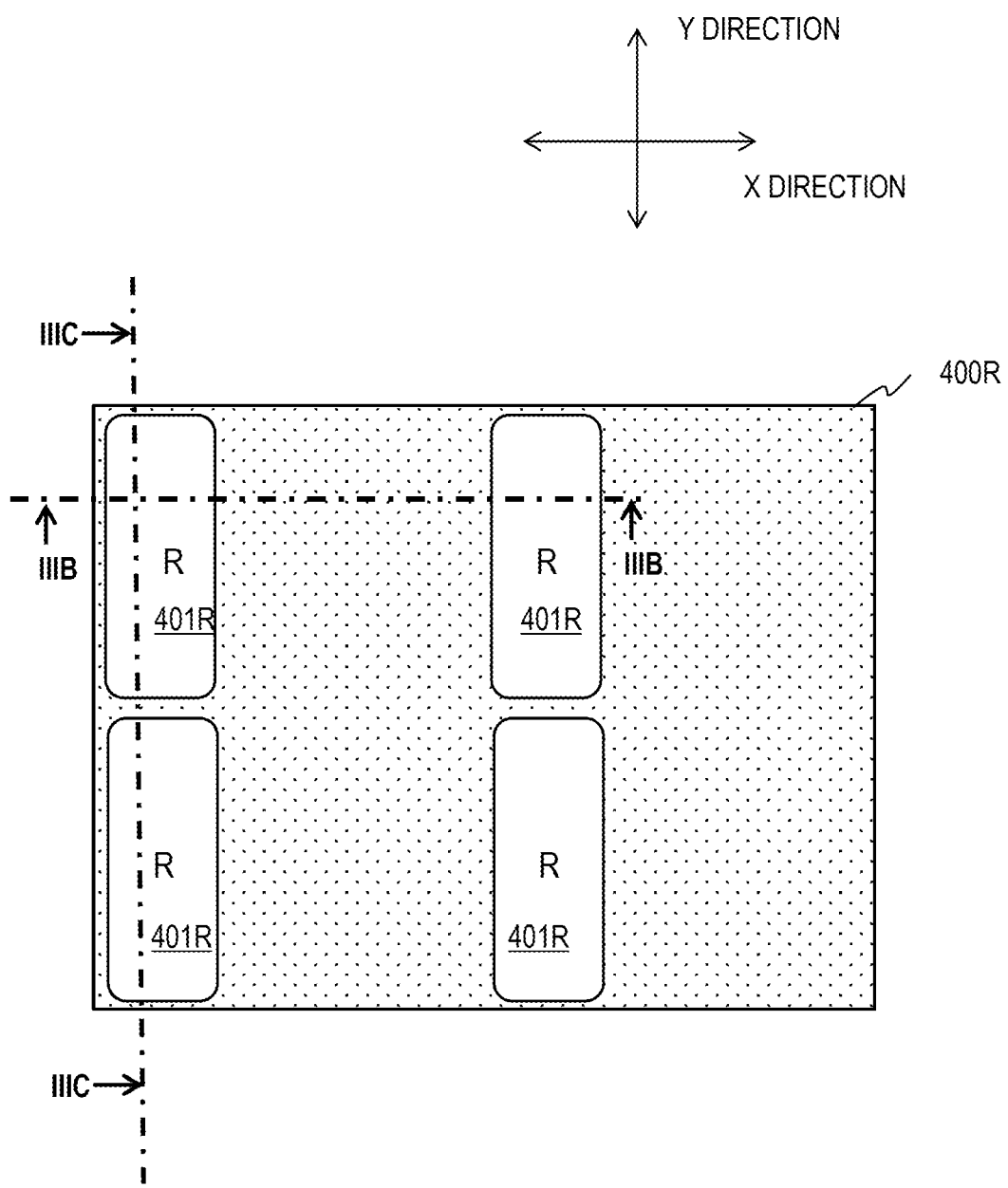
FIG. 3A illustrates one example of a metal mask corresponding to the pattern of the red subpixels R.

FIG. 3A illustrates one example of a metal mask 400R corresponding to the pattern of the red subpixels R. The metal mask 400R has openings 401R arranged so as to correspond to the pattern of the red subpixels R. The X direction is the left and right direction of the page, and the Y direction is the top and bottom direction of the page.

Figure 3B:
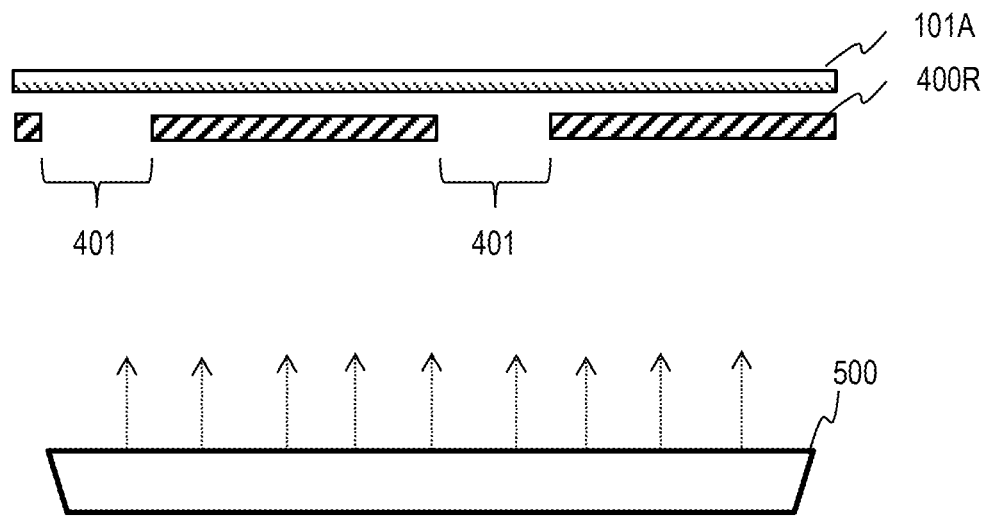
FIG. 3B is a cross-sectional view taken along the line IIIB-IIIB in FIG. 3A.
Figure 3C:
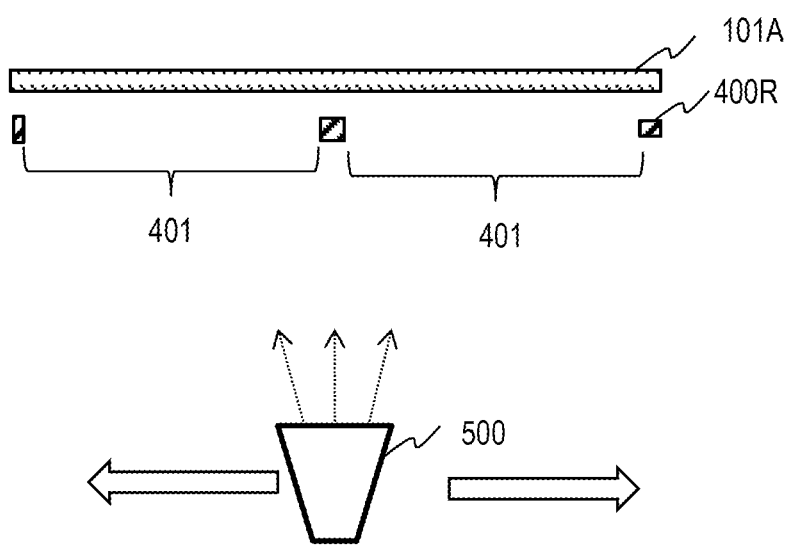
FIG. 3C is a cross-sectional view taken along the line IIIC-IIIC in FIG. 3A.

FIG. 3B is a cross-sectional view taken along the line IIIB-IIIB in FIG. 3A. FIG. 3C is a cross-sectional view taken along the line IIIC-IIIC in FIG. 3A. The substrate 101A of FIG. 3B schematically illustrates the substrate 261 on which the pixel defining layer 253 has been formed. The metal mask 400R is arranged (aligned) so that the organic material for the red subpixels R is vapor-deposited on prescribed locations on the substrate 101A.

A vapor deposition source 500 illustrated in FIGS. 3B and 3C contains the organic material to be deposited. The vapor deposition source 500 contains therein the organic material for the red subpixels R, for example. The organic material contained in the vapor deposition source 500 is heated, and the heated organic material is vaporized. The vaporized organic material is ejected to the outside from an ejection port of a nozzle (not shown in the figure). The ejected organic material passes through the openings 401R of the metal mask 400R, and is deposited at prescribed locations of the substrate 101A, thereby forming a film.

The shape of the vapor deposition source 500 is a rectangular shape, for example. As illustrated in FIG. 3B, the longitudinal direction of the vapor deposition source 500 coincides with the X direction in FIG. 3A. As illustrated in FIG. 3C, the shorter-side direction of the vapor deposition source 500 coincides with the Y direction in FIG. 3A. The vapor deposition source 500 moves along the Y direction of FIG. 3A. This movement is indicated in FIG. 3C by the arrows in the right and left direction on the page.

As illustrated in FIG. 3B, the vapor deposition source 500 ejects the organic material in one way along the X direction of FIG. 3A. This ejection state is indicated by the broken arrows of FIG. 3B. As illustrated in FIG. 3C, the vapor deposition source 500 ejects the organic material in several different ways along the Y direction. This ejection state is indicated by the broken arrows of FIG. 3C.

When the film formation using the organic material is completed, the tapered shape of the organic material in the X direction and the tapered shape of the organic material in the Y direction differ from each other due to the movement direction and the ejection state of the vapor deposition source 500.

Figure 4A:
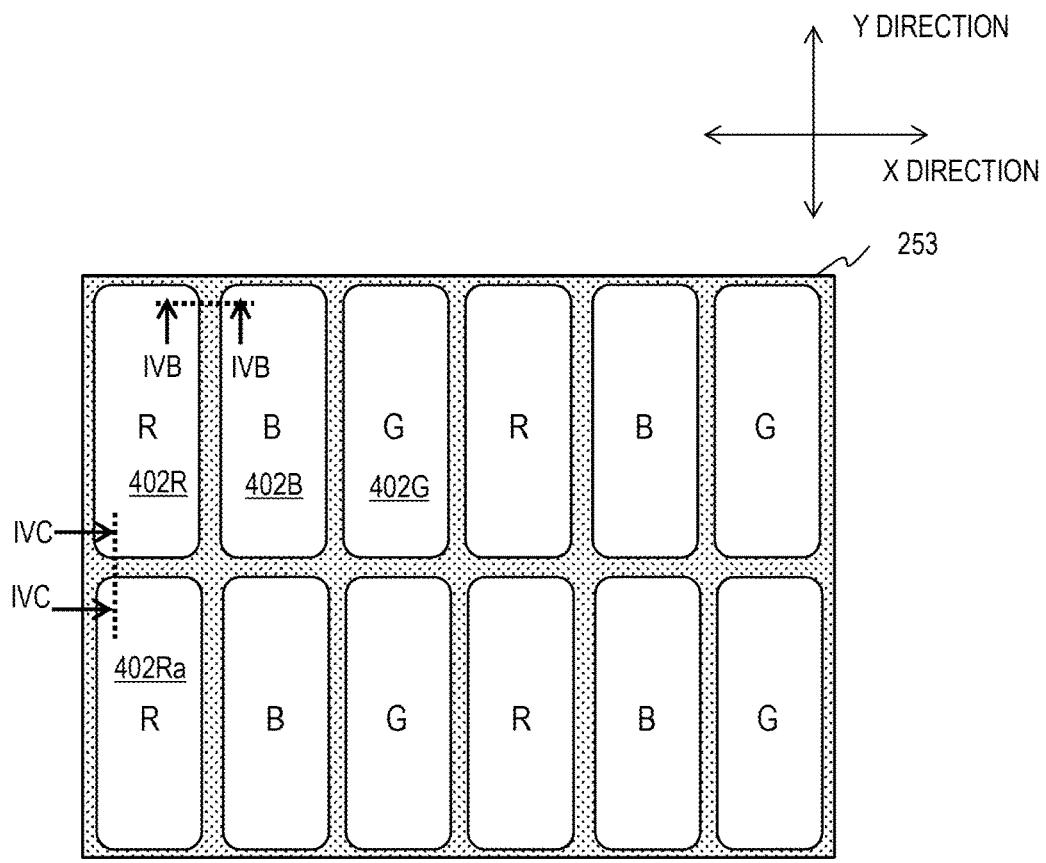
FIG. 4A schematically illustrates a state in which organic materials of respective colors are vapor-deposited on the pixel defining layer.

FIG. 4A schematically illustrates a state in which organic materials of respective colors are vapor-deposited on the pixel defining layer 253. The organic layers 402R, 402Ra of the red pixel respectively illustrate the hole supply layer and the organic light-emitting layer of the red pixel of FIG. 2. The organic layer 402B of the blue pixel schematically illustrates the hole supply layer and the organic light-emitting layer of the blue pixel. The organic layer 402G of the green pixel schematically illustrates the hole supply layer and the organic light-emitting layer of the green pixel. The organic layer 402B for the blue pixel and the organic layer 402G for the green pixel are each deposited using a metal mask having an opening pattern differing from the opening pattern of the metal mask 400R for the red subpixel described with reference to FIG. 3A.

Figure 4B:
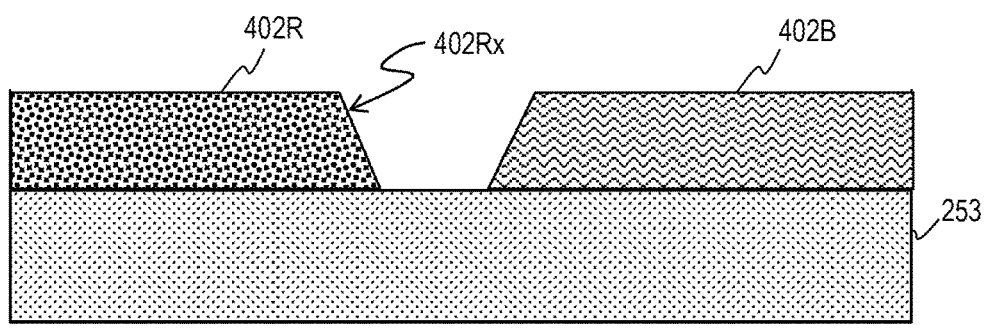
FIG. 4B is a cross-sectional view taken along the line IVB-IVB in FIG. 4A.
Figure 4C:
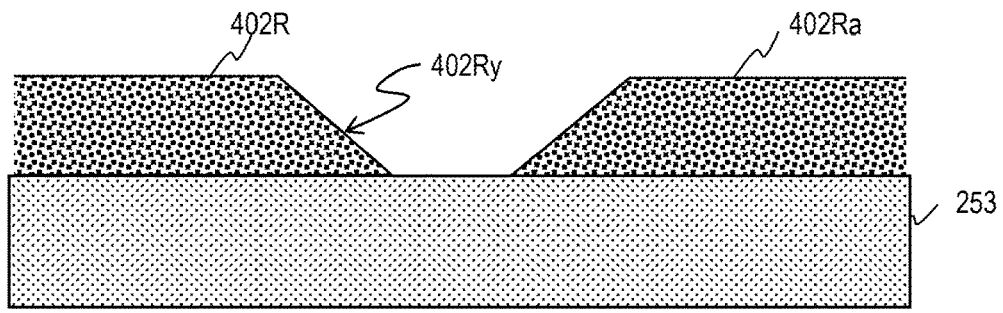
FIG. 4C is a cross-sectional view taken along the line IVC-IVC in FIG. 4A.

FIG. 4B is a cross-sectional view taken along the line IVB-IVB in FIG. 4A, and illustrates tapered shapes of the organic layers 402R and 402B in the X direction, which is the direction along which the vapor deposition source 500 does not move. FIG. 4C is a cross-sectional view taken along the line IVC-IVC in FIG. 4A, and illustrates tapered shapes of the organic layers 402R and 402Ra in the Y direction, which is the direction along which the vapor deposition source 500 does move.

As illustrated in FIGS. 4B and 4C, the taper in the X direction is steeper than the taper in the Y direction. More specifically, the angle of the inclined surface 402Rx of the organic layer 402R in FIG. 4B (the angle with respect to the plane portion of the pixel defining layer 253) is larger than the angle of the inclined surface 402Ry (see FIG. 4C) of the same organic layer 402R.

For other pixels such as the organic layer 402B of the blue pixel or the organic layer 402Ra of the red pixel, the taper in the X direction is steeper than the taper in the Y direction. This is because the vapor deposition source 500 moves in the Y direction, and the organic material is ejected toward different ways along the Y direction, which makes the amount of the organic material deposited in the X direction per unit time larger than the amount of the organic material deposited in the Y direction. As described above, in the X direction along which the subpixels of different colors are arranged, the taper of the organic layer is steeper, which makes it possible to prevent the subpixels of different colors from making contact with each other.

FIGS. 3A to 4C illustrate an example in which the vapor deposition source moves in one direction (for example, Y direction), but it is also possible to form a film by depositing an organic material on the substrate 101A while rotating either the vapor deposition source or the substrate 101A, which is called the rotary film forming method. In the rotary film forming method, the taper shape of the subpixels differs depending on the position of the subpixels in the display panel.

As described above, even in the same pixel, the taper shape of the organic layer differs in the respective directions. This phenomenon occurs only when the organic material is deposited using a metal mask, and does not occur if a film of organic material is formed by spattering or CVD (chemical vapor deposition).

[Manufacturing Method]

An example of the manufacturing method of the OLED display device 10 will be explained. In the descriptions below, the elements formed in the same process (at the same time) are the elements on the same layer The manufacturing process of the OLED display device 10 starts from forming the TFT circuit layer 263 on the insulating substrate 261. The TFT circuit layer 263 can be formed by a known technique, which is not described in detail. Next, an anode electrode is formed on the TFT circuit layer 263. For example, the anode electrode is formed by spattering on a planarization film having a contact hole formed therein.

The anode electrode is constituted of upper ITO/Ag alloy/lower ITO. Instead of the upper ITO, a transparent film of ITO, IZO, ZnO, or $In_2O_3$ or a reflective film made of Ag, Mg, Al, Pt, Pd, Au, Ni, Nd, Ir, Cr or a compound of those metals may be used. Also, instead of the lower ITO, the transparent film described above may be used. The layer structure of the anode electrode may be any structure, and Al may be a single layer, for example. The anode electrode is connected to the pixel circuit in the TFT circuit layer 263 via the contact portion.

Next, the pixel defining layer 253 is formed by depositing a photosensitive organic resin film by spin coating or the like, and patterning the organic resin film. Openings are formed in the pixel defining layer 253 by the patterning, and an anode electrode of each subpixel is exposed through each opening. The respective subpixels (light-emitting regions) are separated by the pixel defining layer 253.

The manufacturing process after the pixel defining layer 253 is formed will be explained with reference to the flowchart of FIG. 5. The hole supply layer of red subpixels is formed on the insulating substrate 261 on which the pixel defining layer 253 is formed (S101). Specifically, by the vapor deposition using a metal mask having a pattern corresponding to the pattern of the red subpixels, the material for the hole supply layer is deposited on the substrate 261 on which the pixel defining layer 253 is formed, thereby forming the hole supply layer of the red subpixels. When the hole supply layer is constituted of a plurality of layers including the hole injection layer and hole transport layer, the film formation is repeatedly performed for the plurality of layers. The thickness of the hole supply layer can be controlled for the micro-cavity structure.

The hole supply layer of green subpixels is formed on the insulating substrate 261 on which the pixel defining layer 253 is formed (S102). Specifically, by the vapor deposition using a metal mask having a pattern corresponding to the pattern of the green subpixels, the material for the hole supply layer is deposited on the substrate 261 on which the pixel defining layer 253 is formed, thereby forming the hole supply layer of the green subpixels. When the hole supply layer includes a plurality of layers, the film formation is repeatedly performed for the plurality of layers. The thickness of the hole supply layer can be controlled for the micro-cavity structure.

Next, the hole supply layer of blue subpixels is formed on the insulating substrate 261 on which the pixel defining layer 253 is formed (S103). Specifically, by the vapor deposition using a metal mask having a pattern corresponding to the pattern of the blue subpixels, the material for the hole supply layer is deposited on the substrate 261 on which the pixel defining layer 253 is formed, thereby forming the hole supply layer of the blue subpixels. When the hole supply layer includes a plurality of layers, the film formation is repeatedly performed for the plurality of layers. The thickness of the hole supply layer can be controlled for the micro-cavity structure.

As illustrated in FIGS. 2B and 2C, in the manufacturing step of this embodiment, the hole supply layer for the subpixel of each color is formed so as to have a greater area then the opening formed in the pixel defining layer 253 (also referred to as a deposition margin). This area is provided, taking into consideration the pattern accuracy of a metal mask, the deformation of a metal mask due to heat generated by the film forming process, the alignment accuracy between the metal mask and the substrate, and the incident angle of the deposition molecules. Steps S104, S105, and S106 may be performed in any order.

Next, the organic light-emitting layer is formed by depositing the organic light-emitting material on the hole supply layer. The organic light-emitting material is deposited for each color of red, green, and blue, thereby forming the organic light-emitting layer on the hole supply layer. The organic light-emitting layer is formed using a metal mask.

First, the organic light-emitting layer for the red subpixels is formed (S104). Specifically, by the vapor deposition using a metal mask having a pattern corresponding to the pattern of the red subpixels, the material for the red organic light-emitting layer is deposited on the hole supply layer of the red subpixels, thereby forming the red organic light-emitting layer.

Next, the organic light-emitting layer for the green subpixels is formed (S105). Specifically, by the vapor deposition using a metal mask having a pattern corresponding to the pattern of the green subpixels, the material for the green organic light-emitting layer is deposited on the hole supply layer of the green subpixels, thereby forming the green organic light-emitting layer.

Next, the organic light-emitting layer for the blue subpixels is formed (S106). Specifically, by the vapor deposition using a metal mask having a pattern corresponding to the pattern of the blue subpixels, the material for the blue organic light-emitting layer is deposited on the hole supply layer of the blue subpixels, thereby forming the blue organic light-emitting layer.

In a manner similar to the hole supply layer, in the film forming process of the organic light-emitting layer of the subpixels of each color, the organic light-emitting layer is deposited in an area greater than the opening formed in the pixel defining layer 253. Furthermore, the organic light-emitting layer of each subpixel is formed so as to cover the hole transport layer of the subpixel completely. Steps S104, S105, and S106 may be performed in any order.

Next, the material for the electron supply layer 271 is deposited on the organic light-emitting layer, thereby forming the electron supply layer 271 commonly used by all subpixels (S107). The electron supply layer 271 is formed so as to cover the entire display region 125. The electron supply layer 271 is formed for all of the subpixels at the same time.

Next, a metal material for the cathode electrode 273 is deposited on the electron supply layer 271 (S108). The cathode electrode 273 is formed so as to cover the entire display region 125. The cathode electrode 273 is formed for all of the subpixels at the same time. The cathode electrode 273 is formed by depositing Li, Ca, LiF/Ca, LiF/Al, Al, Mg or an alloy thereof, for example. After forming the cathode electrode 273, a cap layer may be formed by depositing an insulating layer having a higher refractive rate than glass in order to improve the light extraction efficiency.

Next, a glass flit is built up along the edges of the TFT substrate 100, the sealing substrate 200 is placed thereon, and the glass flit part is heated by laser light, thereby melting the glass flit and completely bonding the TFT substrate 100 and the sealing substrate 200.

Figure 6:
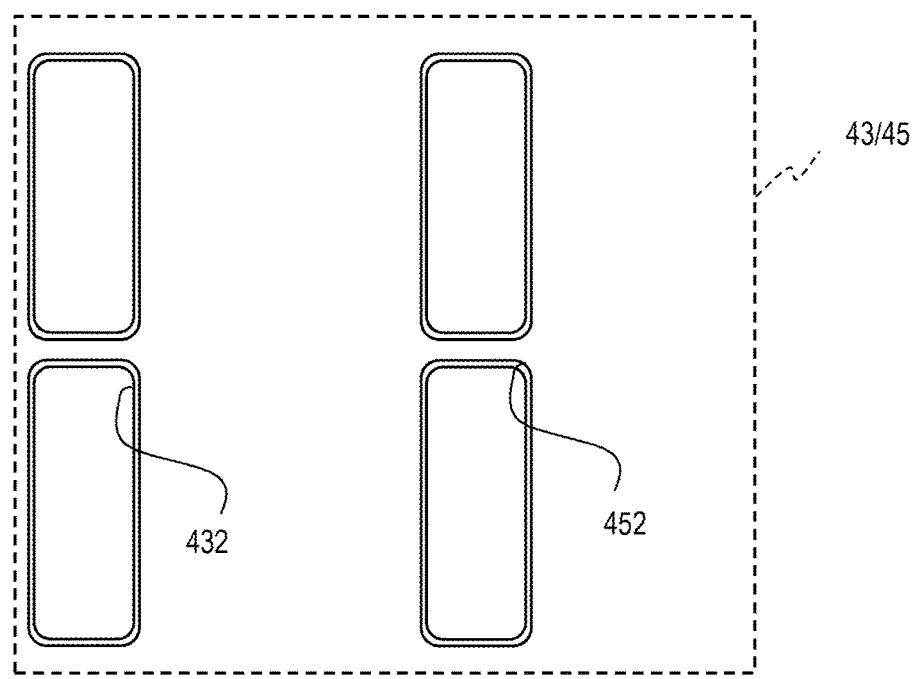
FIG. 6 schematically illustrates the relationship between the metal mask for the hole supply layer of the subpixels of the same color and the metal mask for the organic light-emitting layer.

As described above, in this embodiment, the organic light-emitting layer of the subpixels of each color is formed so as to completely cover the hole supply layer of the subpixels. The hole supply layer and the organic light-emitting layer can be formed by vapor deposition using different metal masks. FIG. 6 schematically illustrates the relationship between the metal mask 43 for the hole supply layer of the subpixels of the same color and the metal mask 45 for the organic light-emitting layer.

The metal mask 43 for the hole supply layer has openings 432 arranged so as to match the pattern of the corresponding subpixels. The metal mask 45 for the organic light-emitting layer has openings 452 arranged so as to match the pattern of the corresponding subpixels. In FIG. 6, only one of a plurality of openings for the hole supply layer is denoted with the reference character 432, and only one of a plurality of openings for the organic light-emitting layer is denoted with the reference character 452.

As illustrated in FIG. 6, the opening 452 for the organic light-emitting layer is larger than the opening 432 for the hole supply layer. The opening 432 for the hole supply layer has a shape and size that can fit within the opening 452 for the organic light-emitting layer. With this relationship, it is possible to ensure that the hole supply layer is completely covered by the organic light-emitting layer. The metal mask 43 for the hole supply layer and the metal mask 45 for the organic light-emitting layer having the relationship described above are prepared for the red subpixels, the blue subpixels, and the green subpixels, respectively.

Figure 7:
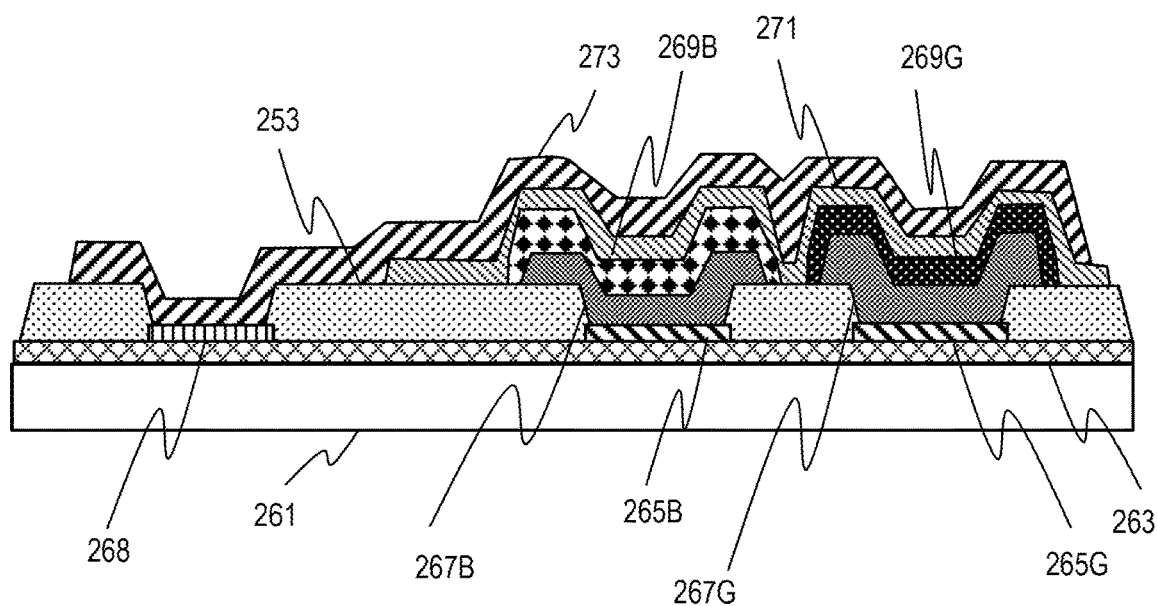
FIG. 7 schematically illustrates a cross-sectional structure of the TFT substrate manufactured using, for the subpixels of the respective colors, the metal mask for the hole supply layer and the metal mask for the organic light-emitting layer.

FIG. 7 schematically illustrates a cross-sectional structure of the TFT substrate 100 manufactured using, for the subpixels of the respective colors, the metal mask for the hole supply layer and the metal mask for the organic light-emitting layer having the relationship described above.

As compared to the configuration example of FIG. 2B, a portion of the organic light-emitting layer 269B of the blue subpixel outside of the hole supply layer 267B of the blue subpixel is greater (the margin is greater), and a portion of the organic light-emitting layer 269G of the green subpixel outside of the hole supply layer 267G of the green subpixel is greater (the margin is greater).

Embodiment 2

Below, the configuration of the display region and the manufacturing method of Embodiment 2 will be explained. The differences from Embodiment 1 will be mainly discussed.

[Configuration of Display Region]

Figure 8A:
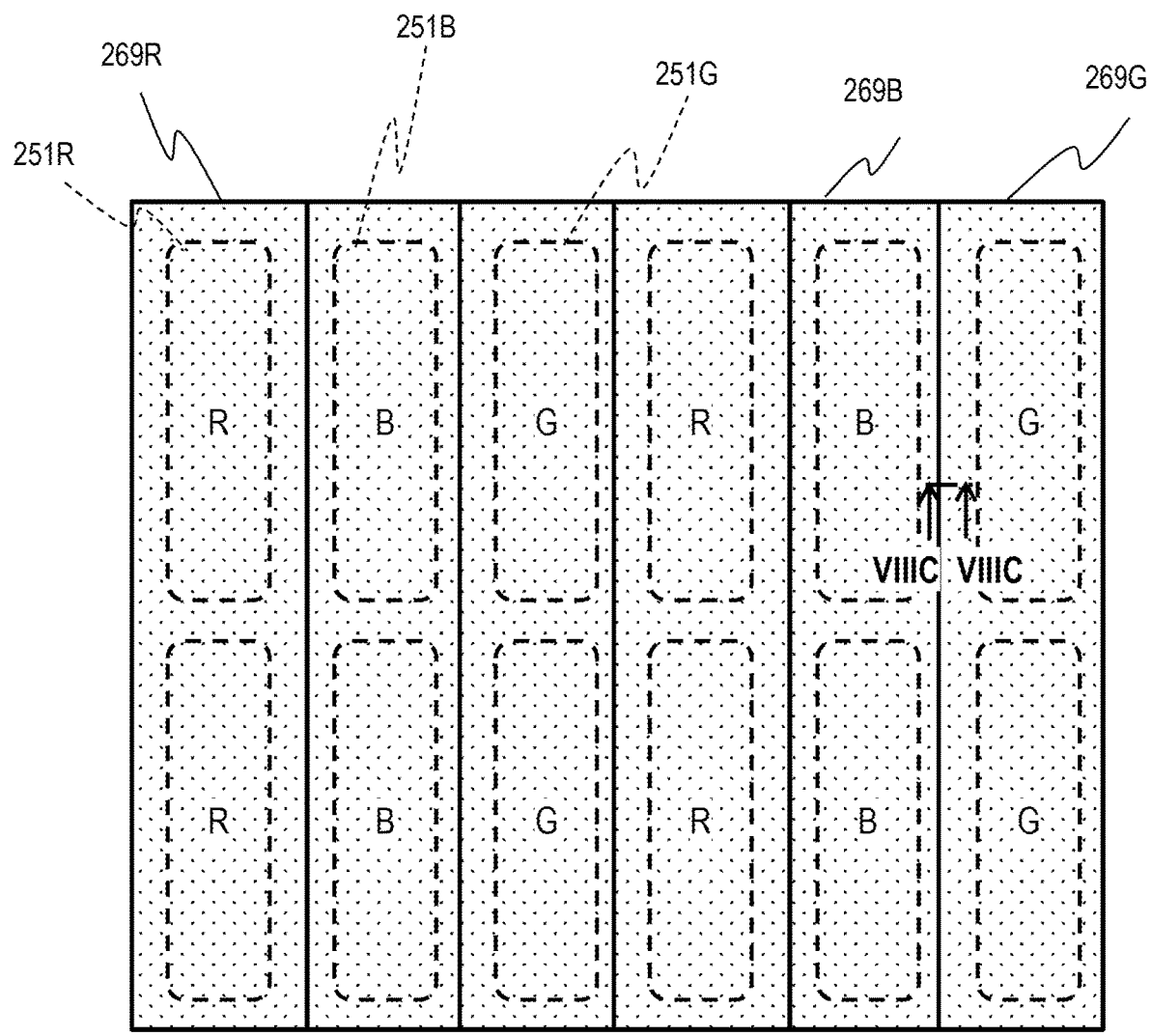
FIG. 8A is a plan view of a part of the display region.

FIG. 8A is a plan view of a part of the display region 125. FIG. 8A illustrates a plurality of subpixels arranged in a matrix. FIG. 8A illustrates red subpixels (light-emitting region) 251R, blue subpixels (light-emitting region) 251B, and green subpixels (light-emitting region) 251G. Among the respective subpixels in FIG. 8A, one red subpixel, one blue subpixel, and one green subpixel are denoted with the reference characters.

The arrangement of the subpixels illustrated in FIG. 8A is the same as the arrangement illustrated in FIG. 2A in Embodiment 1. In this configuration example, the distance between the respective subpixels is smaller due to high definition. The organic light-emitting layers of the subpixels of the same color are formed continuously. Specifically, among the red organic light-emitting layers 269R, the blue organic light-emitting layers 269B, and the green organic light-emitting layers 269G, the organic light-emitting layers of the same color are formed continuously over the respective subpixels and have no gap therebetween, respectively.

The same applies to the hole supply layers although not illustrated in FIG. 8A. That is, among the hole supply layers of the red subpixels, the hole supply layers of the blue subpixels, and the hole supply layers of the green subpixels, the hole supply layers of the same color are formed continuously over the respective subpixels and have no gap therebetween, respectively.

Adjacent organic light-emitting layers of different colors overlap with each other on the top surface of the pixel defining layer 253. In the example of FIG. 8A, an edge of the red organic light-emitting layer 269R is positioned above an edge of the blue organic light-emitting layer 269B, and the other edge of the red organic light-emitting layer 269R is positioned above an edge of the green organic light-emitting layer 269G. The other edge of the green organic light-emitting layer 269G is positioned above an edge of the blue organic light-emitting layer 269B.

Figure 8B:
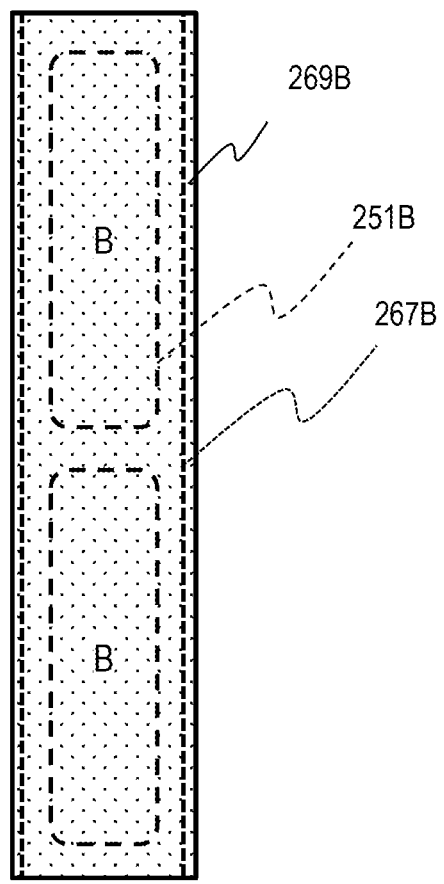
FIG. 8B schematically illustrates the relationship between the hole supply layer of the blue subpixel and the blue organic light-emitting layer.

FIG. 8B schematically illustrates the relationship between the hole supply layer 267B of the blue subpixel and the blue organic light-emitting layer 269B. In this example, the respective hole supply layers 267B are continuously formed in the array direction of the blue subpixels 251B. The hole supply layer 267B has one edge between the blue subpixel 251B and the green subpixel 251G, and the other edge between the blue subpixel 251B and the red subpixel 251R. The organic light-emitting layer 269B is deposited on the hole supply layer 267B so as to completely cover the hole supply layer 267B including the edge of the hole supply layer 267B.

Figure 8C:
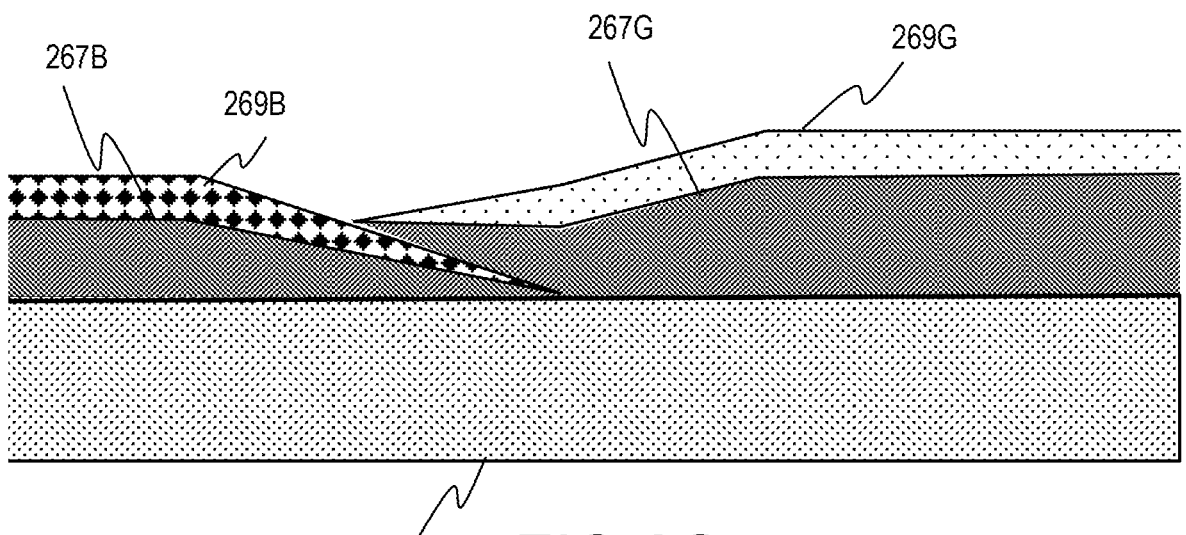
FIG. 8C is a cross-sectional view taken along the line VIIIC-VIIIC in FIG. 8A.

FIG. 8C is a cross-sectional view taken along the line VIIIC-VIIIC in FIG. 8A. FIG. 8C schematically illustrates the layering relationship of the two hole supply layers 267B and 267G and the two organic light-emitting layers 269B and 269G between the blue subpixel 251B and the green subpixel 251G.

In a manner similar to Embodiment 1, the hole supply layer 267B of the blue subpixel is formed so as to cover part of the top surface of the pixel defining layer 253 that surrounds the hole supply layer 267B. That is, the hole supply layer 267B is formed only on a part of the top surface, and the edge of the hole supply layer 267B is located on the top surface of the pixel defining layer 253. The organic light-emitting layer 269B is formed immediately above the hole supply layer 267B or on the hole supply layer 267B so as to make contact with the hole supply layer 267B and form an interface therewith. The blue organic light-emitting layer 269B covers the entire surface including the edge (entire edge) of the hole supply layer 267B.

The hole supply layer 267G of the green subpixel is formed so as to cover part of the top surface of the pixel defining layer 253 that surrounds the hole supply layer 267G. That is, the hole supply layer 267G is formed only on a part of the top surface, and the edge of the hole supply layer 267G is located on the top surface of the pixel defining layer 253.

Further, part of the hole supply layer 267G of the green subpixel overlaps part of the hole supply layer 267B and the organic light-emitting layer 269B of the blue subpixel on the top surface of the pixel defining layer 253. Specifically, the edge portion of the hole supply layer 267G of the green subpixel is directly above the edge portion of the blue organic light-emitting layer 269B. The edge portion of the hole supply layer 267G of the green subpixel forms a multi-layer structure together with the edge portion of the hole supply layer 267B of the blue subpixel and the blue organic light-emitting layer 269B.

The edge of the hole supply layer 267G of the green subpixel is located between the respective edges of the hole supply layer 267B and blue organic light-emitting layer 269B of the blue subpixel, and the blue subpixel 251B. The respective edges of the hole supply layer 267B and blue organic light-emitting layer 269B of the blue subpixel are located between the edge of the hole supply layer 267G of the green subpixel and the green subpixel 251G.

The edge portion of the blue organic light-emitting layer 269B is located between the edge portion of the hole supply layer 267B of the blue subpixel and the edge portion of the hole supply layer 267G of the green subpixel. The edge portion of the blue organic light-emitting layer 269B completely covers the edge of the hole supply layer 267B of the blue subpixel, and therefore, the hole supply layer 267G of the green subpixel is separated from the hole supply layer 267B of the blue subpixel.

As described above, in the configuration in which the hole supply layers of adjacent subpixels partially overlap with each other to achieve higher definition, the organic light-emitting layer is sandwiched between the hole supply layers of adjacent subpixels. The organic light-emitting layer, which is sandwiched between the hole supply layers, covers the lower hole supply layer completely including the edge thereof so that the upper hole supply layer is separated from the lower hole supply layer. By the organic light-emitting layer, which has a smaller carrier mobility and is sandwiched by the hole supply layers of different colors, a leak path between the hole supply layers is blocked.

As described in FIG. 2, when the carrier mobility of the hole supply layer and the organic light-emitting layer is about the same, holes move easily from the hole supply layer to the organic light-emitting layer, but holes do not move from the organic light-emitting layer to the hole supply layer because of a large energy barrier against the holes. Thus, a leak path between the stacked hole supply layers is blocked. This makes it possible to stop the leak current between the respective hole supply layers.

The green organic light-emitting layer 269G is formed immediately above the hole supply layer 267G or on the hole supply layer 267G so as to make contact with the hole supply layer 267G and form an interface. The green organic light-emitting layer 269G covers the entire surface including the edge (entire edge) of the hole supply layer 267G.

In this example, the respective hole supply layers 267G are continuously formed in the array direction of the green subpixels 251G. The hole supply layer 267B has one edge between the blue subpixel 251B and the green subpixel 251G, and the other edge between the blue subpixel 251B and the red subpixel 251R. The organic light-emitting layer 269B is deposited on the hole supply layer 267B so as to completely cover the hole supply layer 267B including the edge of the hole supply layer 267B.

The descriptions made with reference to FIGS. 8B and 8C are applied to the relationship between the hole supply layer 267R and the organic light-emitting layer 269R of the red subpixel and the relationship between the red subpixel 251R and the subpixels 251B and 251G of other colors. In the example, the hole supply layer 267R of the red subpixel is a layer above the green and blue organic light-emitting layers 269G and 269B.

[Manufacturing Method]

Figure 9:
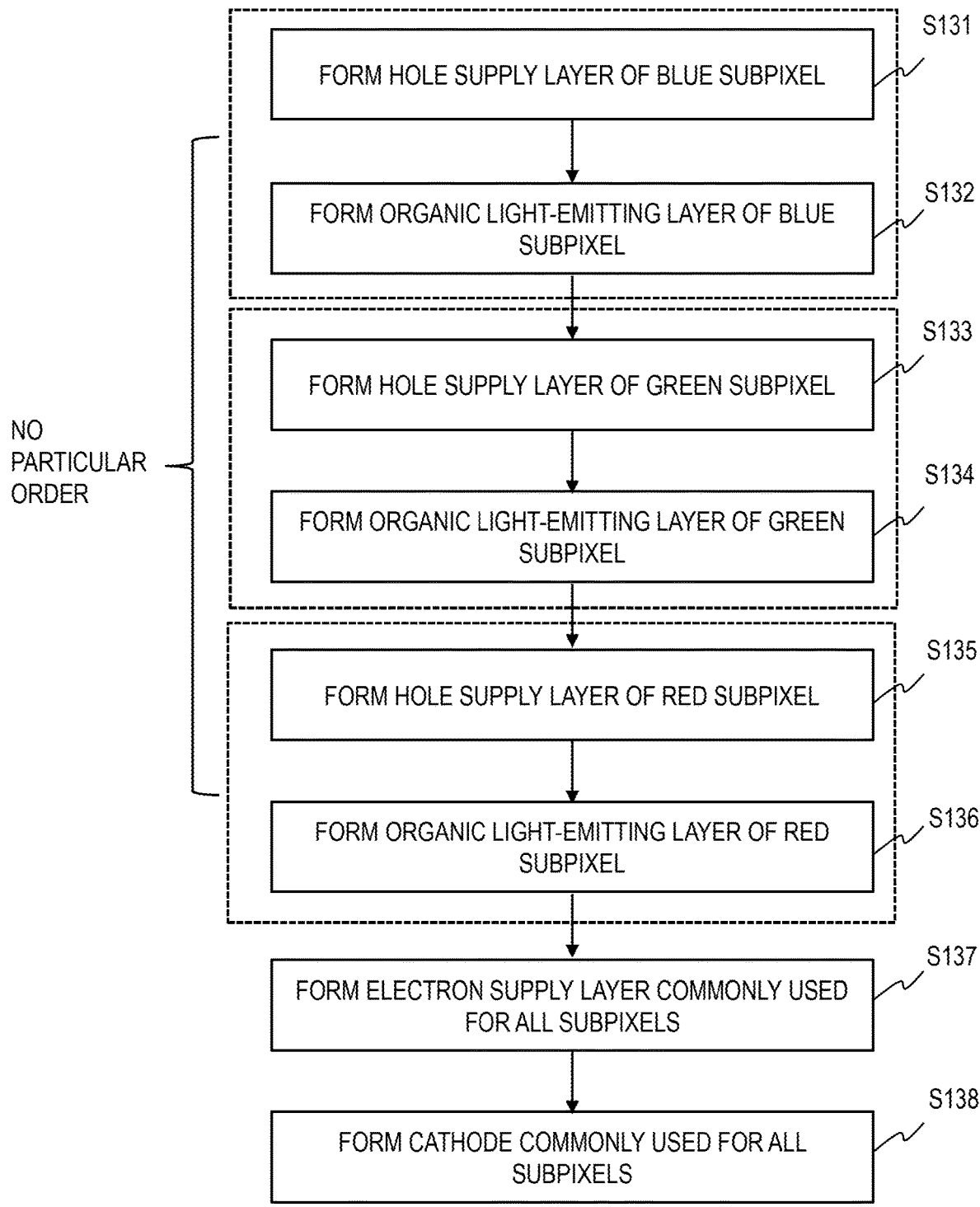
FIG. 9 is a flowchart of the manufacturing method of this embodiment.

Below, the method for manufacturing the OLED display device 1 of this embodiment having the configuration described above will be explained. FIG. 9 is a flowchart of the manufacturing method of this embodiment. The hole supply layer of blue subpixels is formed on the insulating substrate 261 on which the pixel defining layer 253 is formed (S131). Specifically, by the vapor deposition using a metal mask having a pattern corresponding to the pattern of the blue subpixels, the material for the hole supply layer is deposited on the substrate on which the pixel defining layer 253 is formed, thereby forming the hole supply layer of the blue subpixels.

Next, the blue organic light-emitting layer is formed (S132). Specifically, by the vapor deposition using a metal mask having a pattern corresponding to the pattern of the blue subpixels, the material for the blue organic light-emitting layer is deposited on the hole supply layer of the blue subpixels, thereby forming the blue organic light-emitting layer. As described above, the blue organic light-emitting layer is formed on the hole supply layer of the blue subpixel so as to cover the hole supply layer of the blue subpixel completely including the edge thereof.

The metal mask for the hole supply layer of the blue subpixels may be the same as or different from the metal mask for the blue organic light-emitting layer. When a common metal mask is used, by controlling the incident angle of the material with respect to the metal mask, the respective film forming region of the hole supply layer and the organic light-emitting layer can be controlled.

Next, the hole supply layer of green subpixels is formed on the insulating substrate 261 on which the blue organic light-emitting layer is formed (S133). Specifically, by the vapor deposition using a metal mask having a pattern corresponding to the pattern of the green subpixels, the material for the hole supply layer is deposited on the pixel defining layer 253, thereby forming the hole supply layer of the green subpixels.

Next, the green organic light-emitting layer is formed (S134). Specifically, by the vapor deposition using a metal mask having a pattern corresponding to the pattern of the green subpixels, the material for the green organic light-emitting layer is deposited on the hole supply layer of the green subpixels, thereby forming the green organic light-emitting layer. As described above, the green organic light-emitting layer is formed on the hole supply layer of the green subpixels so as to cover the hole supply layer of the green subpixel completely including the edge thereof. The metal mask for the hole supply layer of the green subpixels may be the same as or different from the metal mask for the green organic light-emitting layer.

Next, the hole supply layer of red subpixels is formed on the insulating substrate 261 on which the green organic light-emitting layers are formed (S135). Specifically, by the vapor deposition using a metal mask having a pattern corresponding to the pattern of the red subpixels, the material for the hole supply layer is deposited on the pixel defining layer 253, thereby forming the hole supply layer of the red subpixels.

Next, the red organic light-emitting layer is formed (S136). Specifically, by the vapor deposition using a metal mask having a pattern corresponding to the pattern of the red subpixels, the material for the red organic light-emitting layer is deposited on the hole supply layer of the red subpixels, thereby forming the red organic light-emitting layer. As described above, the red organic light-emitting layer is formed on the hole supply layer of the red subpixels so as to cover the hole supply layer of the red subpixels completely including the edge thereof. The metal mask for the hole supply layer of the red subpixels may be the same as or different from the metal mask for the red organic light-emitting layer.

As described above, a pair of hole supply layer and organic light-emitting layer is formed for subpixels of each color is formed in an appropriate order. Those pairs for the subpixels of different colors may be formed in any particular order. As described above, in the manufacturing method of this embodiment, after the hole supply layer for subpixels of one color is formed, the organic light-emitting layer for subpixels of the same color is formed, instead of forming the hole supply layer for another color. This makes it possible to form the organic light-emitting layer having a smaller carrier mobility than that of the hole supply layer between hole supply layers in the configuration where the edge portions of the hole supply layers of the subpixels of different colors overlap with each other. As a result, the leak current between the hole supply layers can be prevented more effectively.

Next, the material for the electron supply layer 271 is deposited, thereby forming the electron supply layer 271 commonly used by all subpixels (S137). The electron supply layer 271 is formed so as to cover the entire display region 125. Next, a metal material for the cathode electrode 273 is deposited on the electron supply layer 271 (S138). The formation of the electron supply layer 271 and the cathode electrode 273 is the same as that of Embodiment 1. The manufacturing method of this embodiment may be used to manufacture the OLED display device 1 having the configuration explained in Embodiment 1.

Embodiment 3

Figure 10:
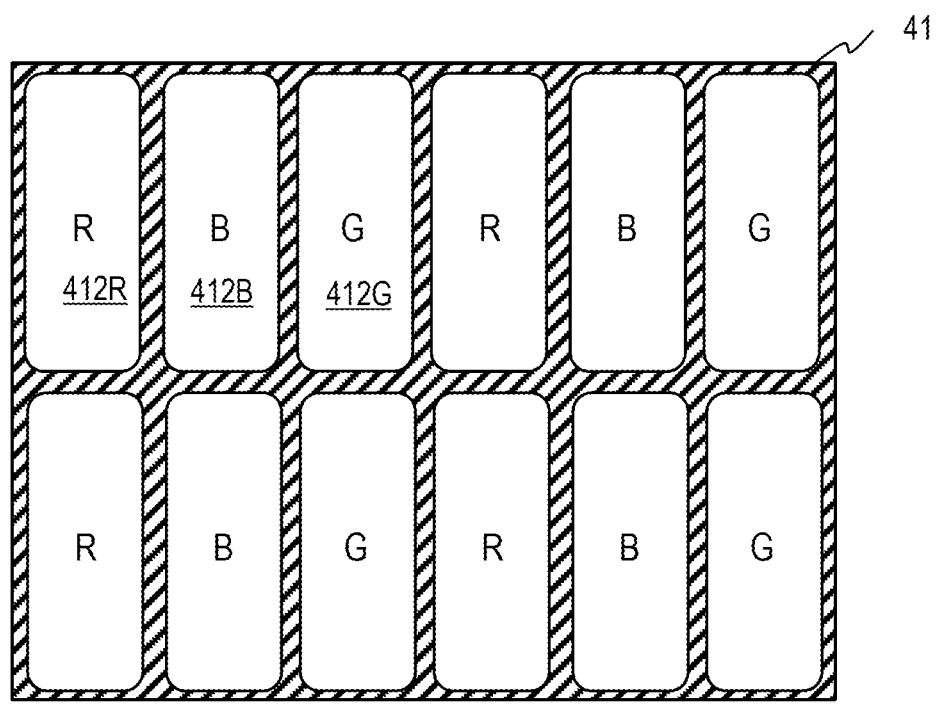
FIG. 10 schematically illustrates the configuration example of the metal mask used for forming the hole supply layer.

Below, the manufacturing method of Embodiment 3 will be explained. The differences from the other embodiments will be mainly discussed. In this embodiment, the hole supply layers for the subpixels of all colors are formed at the same time. FIG. 10 schematically illustrates the configuration example of the metal mask 41 used for forming the hole supply layer. The metal mask 41 has openings 412R for the hole supply layer of red subpixels, openings 412B for the hole supply layer of blue subpixels, and openings 412G for the hole supply layer of green subpixels. In FIG. 10, only one opening of each color is given a reference character. The opening patterns coincide with the patterns of subpixels.

Figure 11:
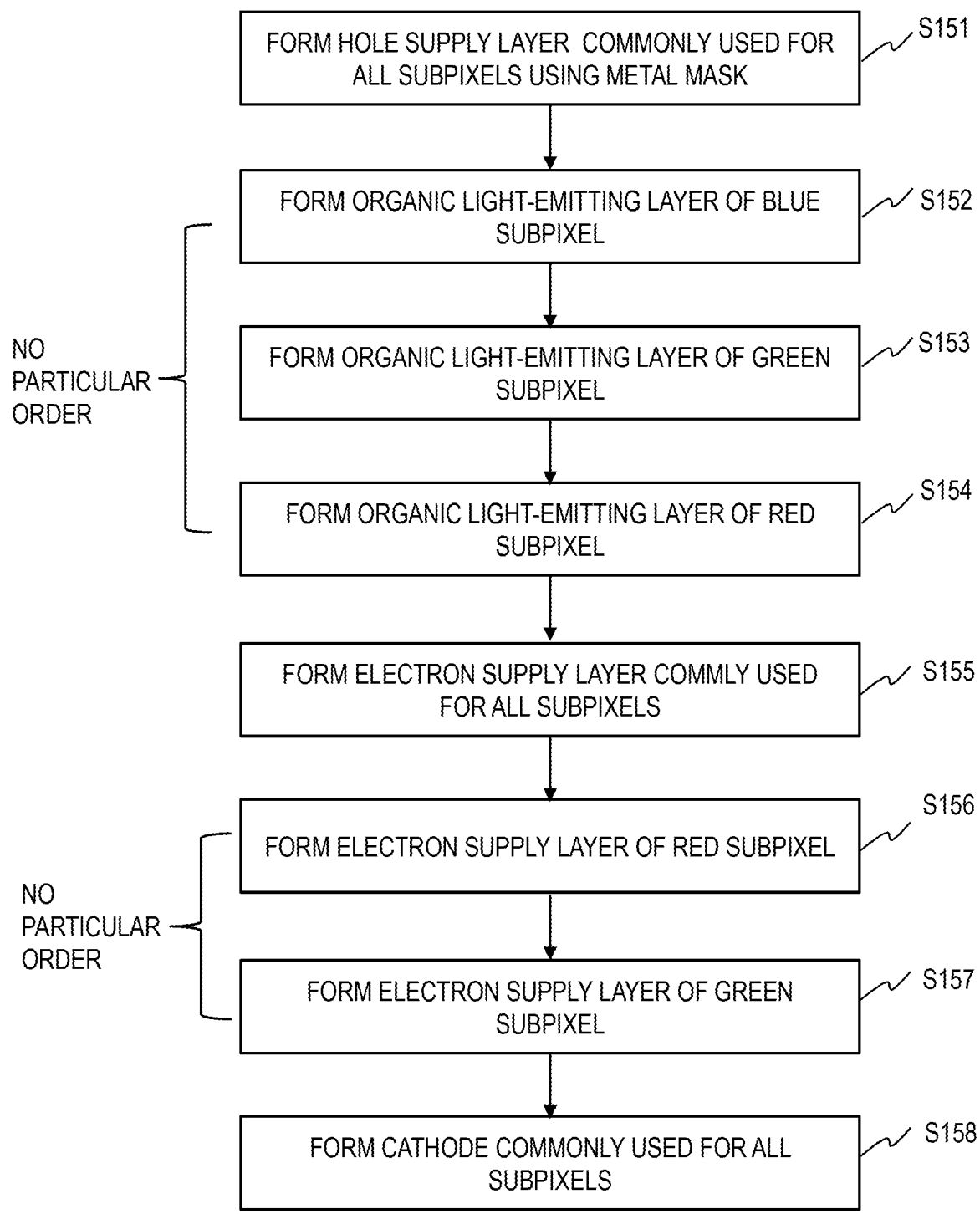
FIG. 11 is a flowchart of the manufacturing method for forming the respective hole supply layers using the metal mask illustrated in FIG. 10.

FIG. 11 is a flowchart of the manufacturing method for forming the respective hole supply layers using the metal mask 41 illustrated in FIG. 10. The hole supply layers for all subpixels are formed on the insulating substrate 261 on which the pixel defining layer 253 is formed (S151). Specifically, by the vapor deposition using the metal mask 41 having an opening pattern for all subpixels as in FIG. 10, the material for the hole supply layers is deposited on the substrate 261 on which the pixel defining layer 253 is formed, thereby forming the hole supply layers of all subpixels. By using the common metal mask 41, the hole supply layers can be formed efficiently.

Next, on the hole supply layers, the organic light-emitting layer of blue subpixels, the organic light-emitting layer of green subpixels, and organic light-emitting layer of red subpixels are formed in this order by vapor deposition using different metal masks (S152, S153, and S154). Similar to other embodiments, the organic light-emitting layer for subpixels of each color is formed so as to cover the corresponding hole supply layer completely. The organic light-emitting layers of three colors may be formed in any order.

Next, the material for the electron supply layer is deposited, thereby forming the electron supply layer commonly used by all subpixels (S155). The electron supply layer is formed so as to cover the entire display region 125. Next, the electron supply layer for red subpixels only is formed by the vapor deposition using a metal mask (S156). Next, the electron supply layer for green subpixels only is formed by the vapor deposition using a metal mask (S157).

By adding the electron supply layers for the red subpixels and green subpixels selectively, the thickness of the electron supply layer for subpixels of each color can be controlled. The electron supply layer for the red subpixels may be formed before or after the electron supply layer for the green subpixels. It is also possible to form the electron supply layer for the red subpixels (only) after forming the electron supply layer for all subpixels, and then forming the electron supply layer for the red subpixels and green subpixels (not for the blue subpixels).

If the micro-cavity structure is not necessary, only one electron supply layer commonly used for all subpixels may be formed.

Next, a metal material for the cathode electrode is deposited on the electron supply layer (S158). The formation of the cathode electrode is the same as that of Embodiment 1.

The various cross-sectional structures of the OLED device will be explained with reference to FIGS. 12 to 16. Below the anode electrode of a subpixel, a pixel circuit for driving the OLED device of this subpixel is formed, but this pixel circuit is not shown in the figures.

Figure 12:
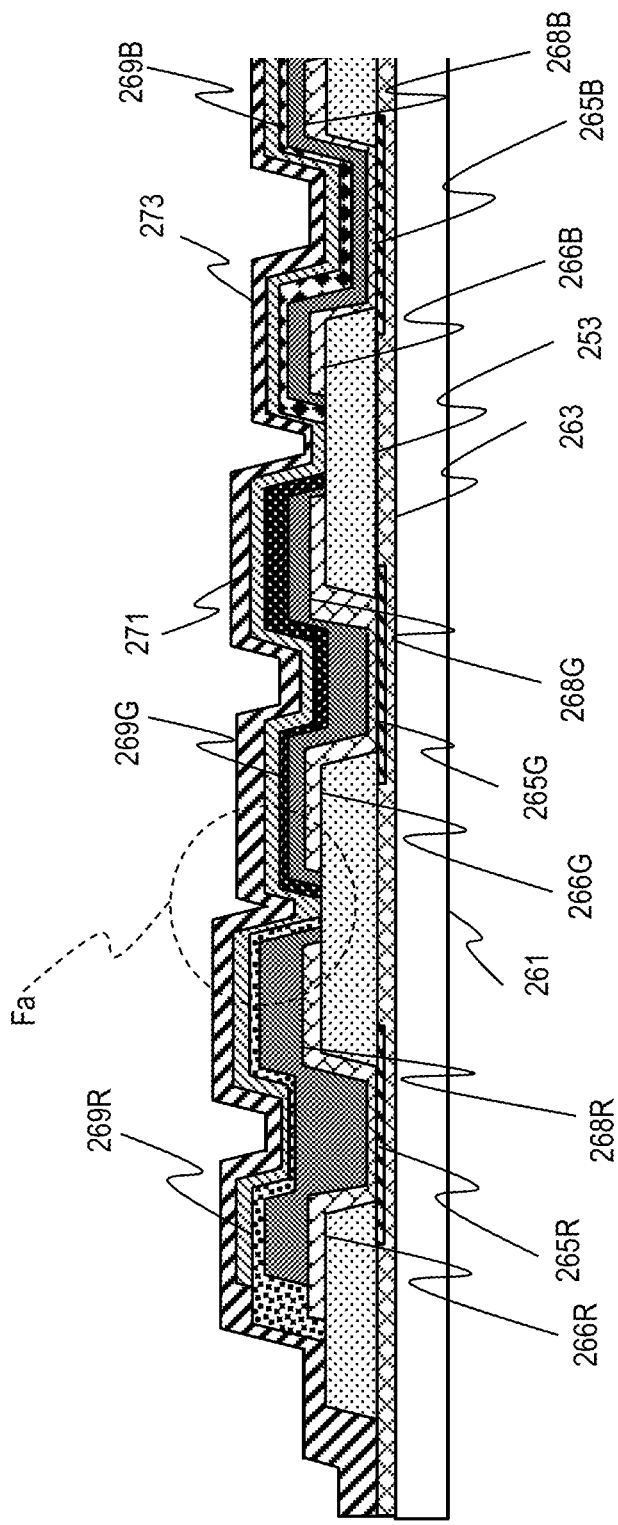
FIG. 12 is a schematic diagram of the cross-sectional structure of the TFT substrate.

FIG. 12 is a schematic diagram of the cross-sectional structure of the TFT substrate 100. The hole injection layer 266R and the hole transport layer 268R are formed on the anode electrode 265R of the red subpixel. The hole injection layer 266G and the hole transport layer 268G are formed on the anode electrode 265G of the green subpixel. The hole injection layer 266B and the hole transport layer 268B are formed on the anode electrode 265B of the blue subpixel.

As indicated by the broken line circle Fa, the organic light-emitting layer 269R of the red subpixel covers the hole injection layer 269R and the hole transport layer 268R. The organic light-emitting layer 269G of the green subpixel covers the hole injection layer 269G and the hole transport layer 268G. The organic light-emitting layer 269B of the blue subpixel covers the hole injection layer 269B and the hole transport layer 268B. This makes it possible to prevent a carrier leak even if the hole injection layer/hole transport layer of one color overlaps with the hole injection layer/hole transport layer of another color due to an alignment error of the metal mask or the like. That is, if the distance between two subpixels is made smaller in order to realize higher definition, the hole supply layers of adjacent subpixels overlap with each other in some cases. However, in this case as well, as described in FIG. 8C, by having the organic light-emitting layer with a smaller carrier mobility sandwiched between the hole supply layers of different colors, the leak path can be blocked.

Figure 13:
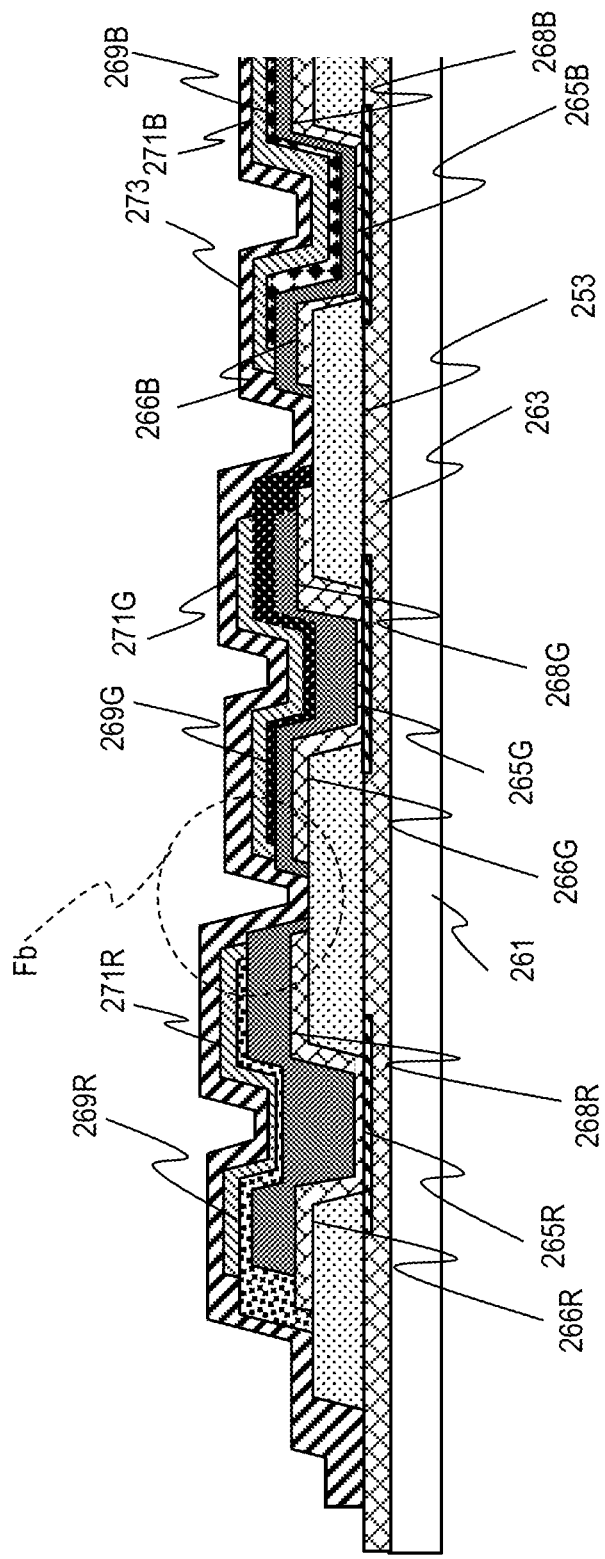
FIG. 13 is a schematic diagram of the cross-sectional structure of the TFT substrate.

FIG. 13 is a schematic diagram of the cross-sectional structure of the TFT substrate 100. The electron supply layer is formed for each subpixel. Each red subpixel, each green subpixel, and each blue subpixel includes the electron supply layer 271R, the electron supply layer 271G, and the electron supply layer 271B, and those layers are separated from each other.

As indicated by the broken line circle Fb, the cathode electrode 273 is in contact with the pixel defining layer 253. The cathode electrode 273 is formed between the hole transport layer 268R and the hole transport layer 268G. With this structure, a leak current from the hole transport layer 268R, for example, is extracted by the cathode electrode 273, and does not flow toward the hole transport layer 268G of the green subpixel adjacent to the red subpixel. That is, the leak current does not flow between the adjacent subpixels. As long as the hole injection layer/hole transport layer of the adjacent pixels do not overlap at all (are completely separated), any layer structure on the pixel defining layer 253 may be employed.

Figure 14:
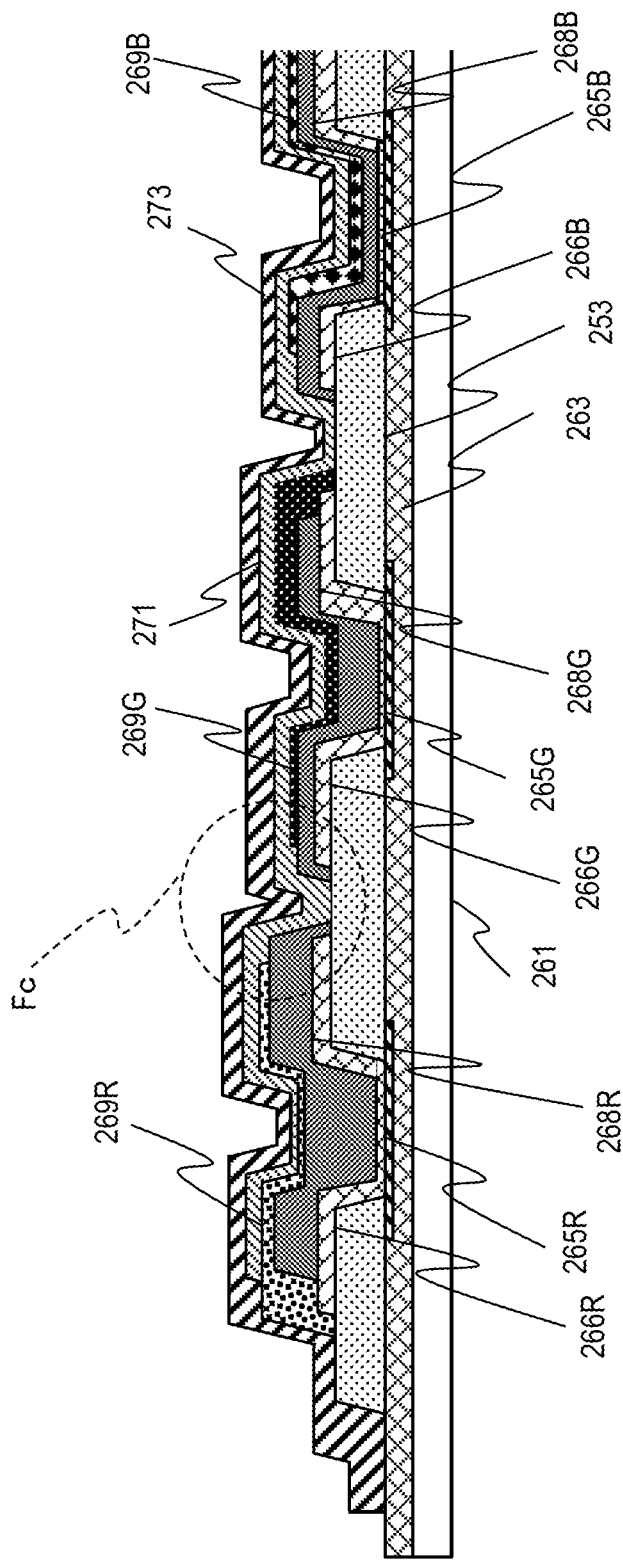
FIG. 14 is a schematic diagram of the cross-sectional structure of the TFT substrate.

FIG. 14 is a schematic diagram of the cross-sectional structure of the TFT substrate 100. The electron supply layer 271 is commonly used for all of the subpixels. As indicated by the broken line circuit Fc, the electron supply layer 271 is in contact with the pixel defining layer 253. The electron supply layer 271 is formed between the hole transport layer 268R and the hole transport layer 268G. With this structure, it is possible to block a current in the hole transport layer 268R, for example, from flowing into the hole transport layer 268G of the green subpixel, which is adjacent to the red subpixel.

That is, it is possible to prevent the leak current from flowing between the adjacent subpixels via the electron supply layer 271. This is made possible by a large resistance (energy barrier) of the electron supply layer 271. As long as the hole injection layer/hole transport layer of the adjacent pixels do not overlap at all (are completely separated), any layer structure on the pixel defining layer 253 may be employed.

Figure 15:
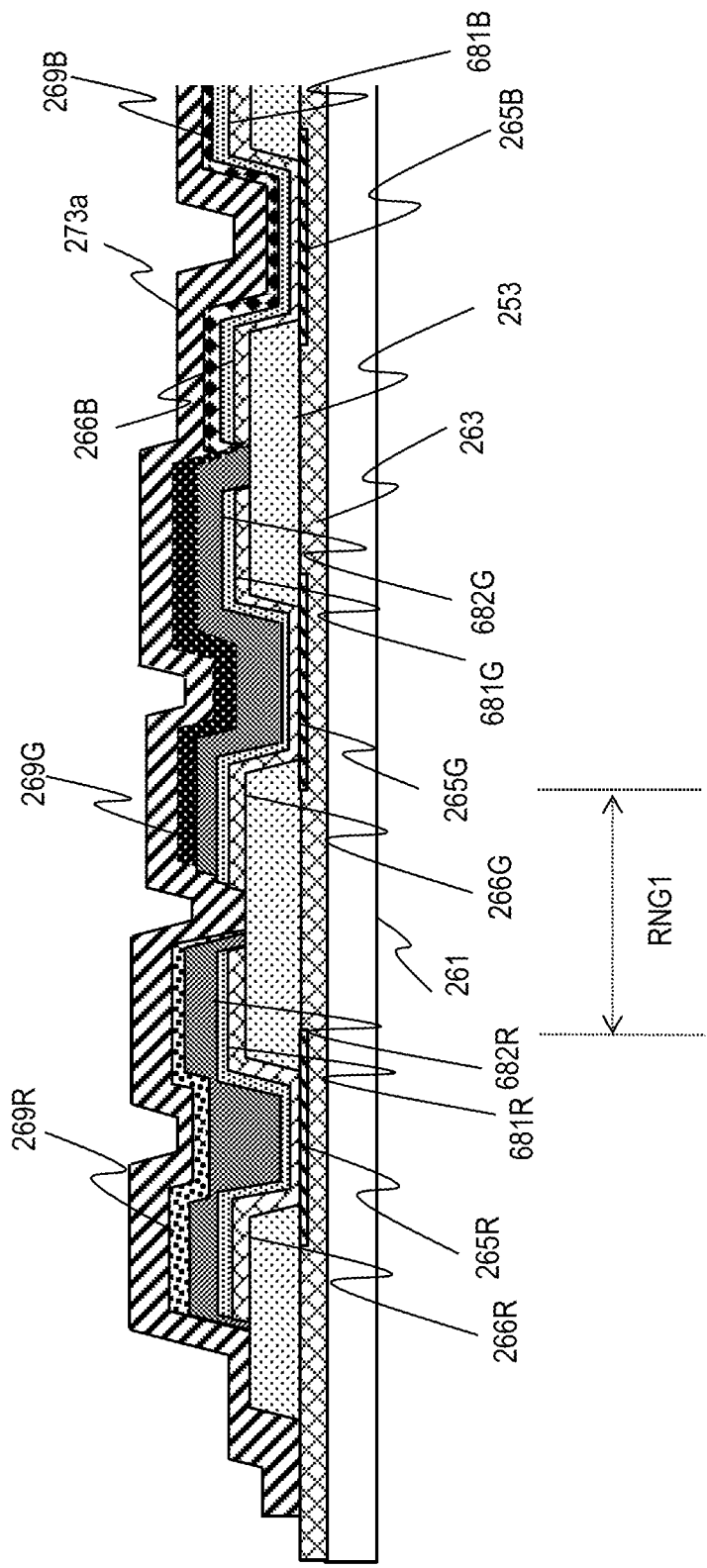
FIG. 15 is a schematic diagram of the cross-sectional structure of the TFT substrate.

FIG. 15 is a schematic diagram of the cross-sectional structure of the TFT substrate 100. In the red subpixel, the hole transport layer having two layers of a lower hole transport layer 681R and an upper hole transport layer 682R is formed between the organic light-emitting layer 269R and the hole injection layer 266R. In the green subpixel, the hole transport layer having two layers of a lower hole transport layer 681G and an upper hole transport layer 682G is formed between the organic light-emitting layer 269G and the hole injection layer 266G. In the blue subpixel, the hole transport layer 681B having only one layer is formed between the organic light-emitting layer 269B and the hole injection layer 266B. The cathode electrode and the electron supply layer 273a are in contact with the organic light-emitting layers 269R, 269G, and 269B. As described above, the electron supply layer may include an electron injection layer and an electron transport layer, or the electron supply layer may be constituted of one layer or three or more layers having the functions of those layers.

The hole injection layers (266R, 266G, 266B) of the respective colors, the respective lower hole transport layers (681R, 681G), and the blue hole transport layer 681B are formed using the same metal mask so as to be separated from each other. The organic light-emitting layer 269R and the hole transport layer 682R of the red subpixel are formed using the same metal mask. The organic light-emitting layer 269G and the hole transport layer 682G of the green subpixel are formed using the same metal mask. The organic light-emitting layer 269B of the blue subpixel is formed independently without sharing a metal mask with other layers.

As described above, the lower hole transport layers (681R, 681G) of the red and green subpixels and the hole transport layer 681B of the blue subpixel are formed using the common metal mask, and the red and green subpixels also have the upper hole transport layers (682R, 682G). This makes it possible to adjust the thickness of the hole transport layer of each color, thereby realizing the micro-cavity structure. The cathode electrode and the electron supply layer 273a are formed so as not to be separated (common layer), using the same metal mask.

Below, an alignment error between the substrate and metal mask, or in other words, a positioning error that occurs when the substrate and the metal mask are stacked will be explained. In positioning the metal mask against the substrate, it is impossible to completely eliminate alignment error. Thus, in the alignment design, a prescribed allowance for the alignment error is set. Examples thereof include a strict allowance condition (such as +/−2 μm or smaller), or a lenient allowance condition (such as +/−5 μm or smaller).

The organic light-emitting layer 269R and the hole transport layer 682R of the red subpixel are formed using a metal mask that is positioned so as to satisfy the strict allowance condition. The organic light-emitting layer 269G and the hole transport layer 682G of the green subpixel are formed using a metal mask aligned in a position that satisfies the lenience allowance condition but not the strict allowance condition, due to the alignment error that occurred at the blue subpixel side (the right side in FIG. 15). The organic light-emitting layer 269R of the red subpixel is formed using a metal mask aligned in a position that satisfies the lenient allowance condition but not the strict allowance condition, due to the alignment error that occurred at the green subpixel side (the right side in FIG. 15).

The hole supply layer and the organic light-emitting layer are deposited such that the separation part of the hole supply layer and the organic light-emitting layer comes within the region RNG1 between an edge of the anode electrode of the first subpixel (red subpixel, for example) and an edge of the anode electrode of the second subpixel (green subpixel, for example) adjacent to the first subpixel.

Figure 16:
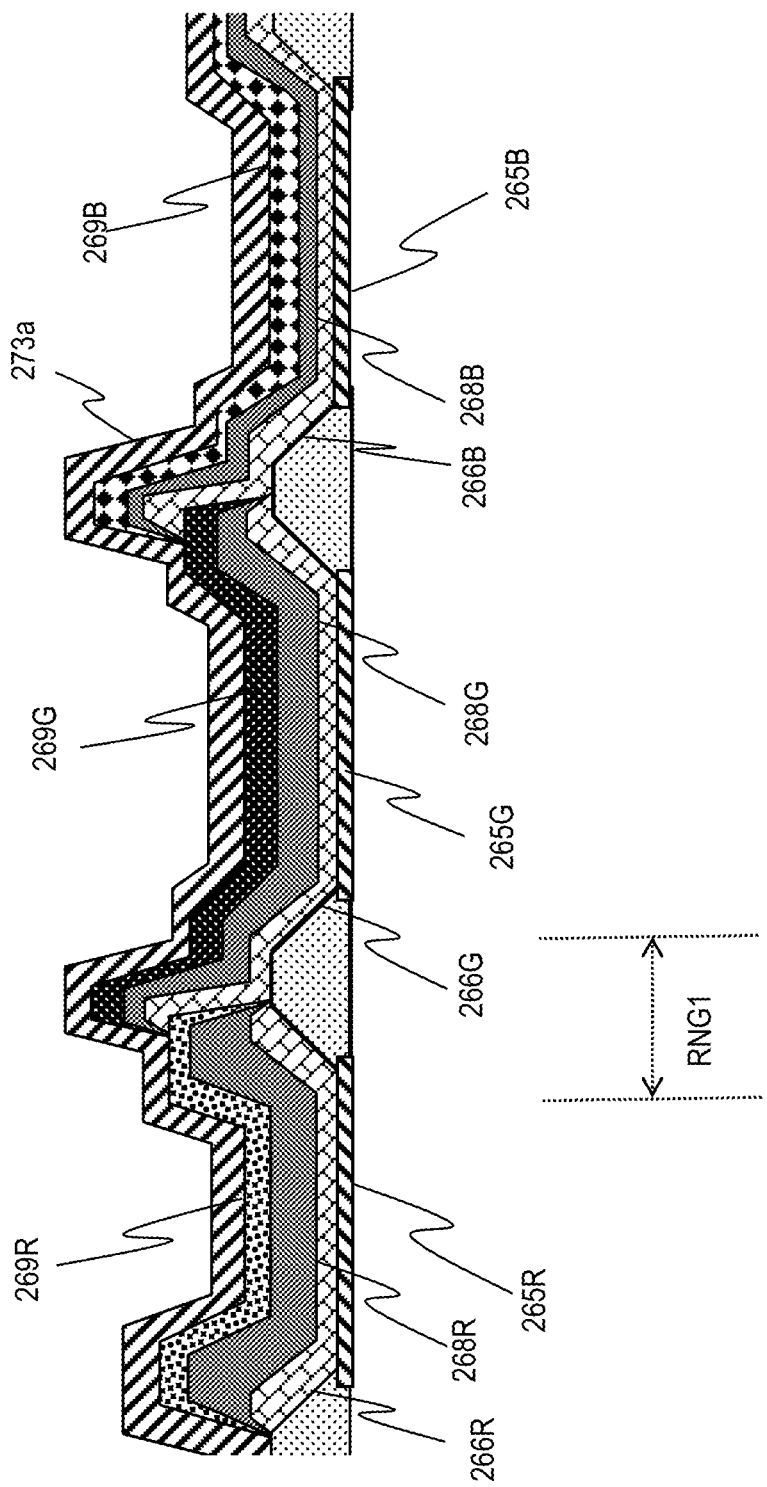
FIG. 16 is a schematic diagram of the cross-sectional structure of the TFT substrate.

FIG. 16 is a schematic diagram of the cross-sectional structure of the TFT substrate 100. The cathode electrode and the electron supply layer 273a are in contact with the organic light-emitting layers 269R, 269G, and 269B. The organic light-emitting layer 269R, the hole transport layer 268R, and the hole injection layer 266R of the red subpixel are formed using the same metal mask. The organic light-emitting layer 269G, the hole transport layer 268G, and the hole injection layer 266G of the green subpixel are formed using the same metal mask.

The organic light-emitting layer 269B, the hole transport layer 268B, and the hole injection layer 266B of the blue subpixel are formed using the same metal mask. The cathode electrode and the electron supply layer 273a are formed so as not to be separated (common layer), using the same metal mask.

The organic light-emitting layer 269R, the hole transport layer 268R, and the hole injection layer 266R of the red subpixel are formed using a metal mask aligned in a position that satisfies the lenience allowance condition but not the strict allowance condition, due to the alignment error that occurred at the green subpixel side (the right side in FIG. 16).

The organic light-emitting layer 269G, the hole transport layer 268G, and the hole injection layer 266G of the green subpixel are formed using a metal mask that is positioned so as to satisfy the strict allowance condition. The organic light-emitting layer 269B, the hole transport layer 268B, and the hole injection layer 266B of the blue subpixel are formed using a metal mask aligned in a position that satisfies the lenience allowance condition but not the strict allowance condition, due to the alignment error that occurred at the green subpixel side (the left side in FIG. 16).

When the metal mask is misaligned as described above, with the conventional configuration, it was not possible to produce quality products if the strict allowance condition was not satisfied, but with the configuration of this application, as long as the lenience allowance condition is satisfied, the organic light-emitting layers of the respective colors can be separated from each other, which allows for quality products to be made and improves the yield of the manufacturing process.

Embodiment 4

First, the overview of Embodiment 4 will be explained. In order to achieve higher definition, the distance between the respective subpixels is made shorter. As illustrated in FIG. 8C, when this distance is smaller, the organic light-emitting layer of a subpixel can overlap with the hole supply layer of an adjacent subpixel due to several reasons such as misalignment of the metal mask. In Embodiment 4, the multilayer structure that can prevent the degradation of image quality due to crosstalk between the subpixels even if the layers overlap unintendedly will be explained.

In order to drive the OLED element to emit light, it is necessary to energize the OLED element with a voltage that equal to or greater than the light-emitting threshold voltage. The light-emitting threshold voltage means the minimum voltage that can drive the OLED element to emit light. For example, in order for the blue subpixel 251B to emit light, it is necessary to cause a current to flow from the anode electrode 265B to the cathode electrode 273 (see FIG. 8) at a level equal to or greater than the light-emitting threshold voltage of the blue subpixel 251B. The light-emitting threshold voltages (will be referred to as the threshold voltage below) differ among the subpixels of different colors. For example, the threshold voltage of the blue OLED element is higher than the threshold value of the green OLED element. The threshold voltage of the green OLED element is higher than the threshold value of the red OLED element.

In Embodiment 4, taking advantage of the fact that the light-emitting threshold voltages of the subpixels differ among respective colors, the layer structure of the organic light-emitting layer and the like of each color is configured so that crosstalk between the subpixels is prevented. Below, the configuration of the display region and the manufacturing method of Embodiment 4 will be explained. The differences from Embodiment 1 will be mainly discussed.

Figure 17:
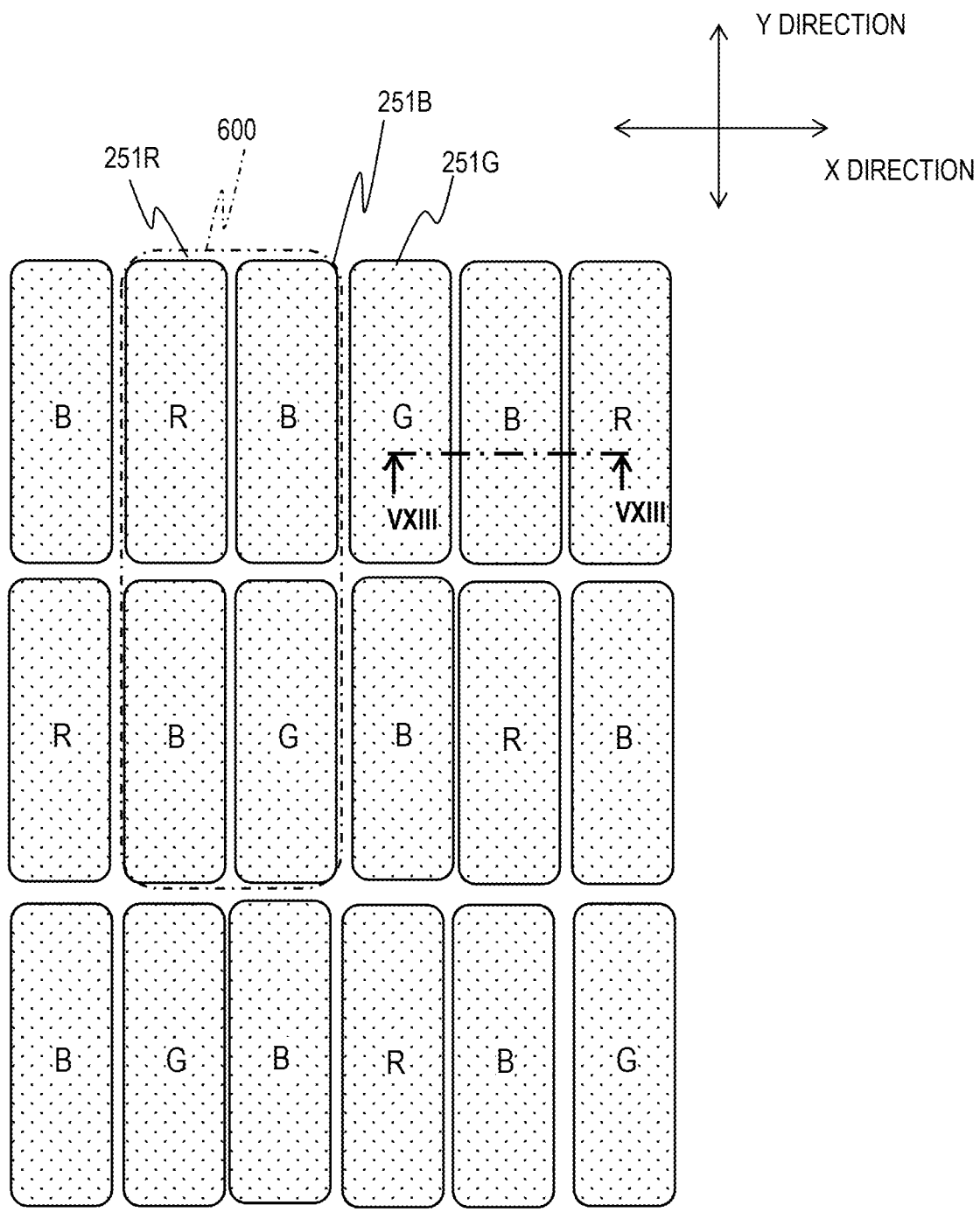
FIG. 17 is a plan view of a part of the display region.

FIG. 17 is a plan view of a part of the display region 125. FIG. 17 illustrates a plurality of subpixels arranged in a matrix. FIG. 17 illustrates red subpixels (light-emitting region) 251R, blue subpixels (light-emitting region) 251B, and green subpixels (light-emitting region) 251G. Among the subpixels in FIG. 17, one red subpixel, one blue subpixel, and one green subpixel are denoted with the respective reference characters.

In the layout of the subpixels of FIG. 17, the plurality of subpixels are arranged in a matrix. Unlike the layout illustrated in FIG. 2A of Embodiment 1, subpixels of the same color are not lined up in the column direction (top and bottom direction in FIG. 17). That is, the red subpixel 251R is adjacent to the blue subpixels 251B in each of the column and row directions, and the green subpixel 251G is adjacent to the blue subpixels 251B in each of the column and row directions. The row direction is X direction, and the column direction is Y direction.

In other words, in the pixel layout of FIG. 17, the blue subpixels 251B, which have the highest threshold voltage among the threshold voltages of the red subpixel 251R, the blue subpixel 251B, and the green subpixel 251G, are arranged so as to surround the red subpixel 251R and the green subpixel 251G, respectively. One main pixel is constituted of two blue subpixels adjacent in the diagonal direction, one red subpixel and one green subpixel adjacent to each other in the diagonal direction. In FIG. 17, one main pixel 600 is indicated with the one-dot chain line.

Figure 18:
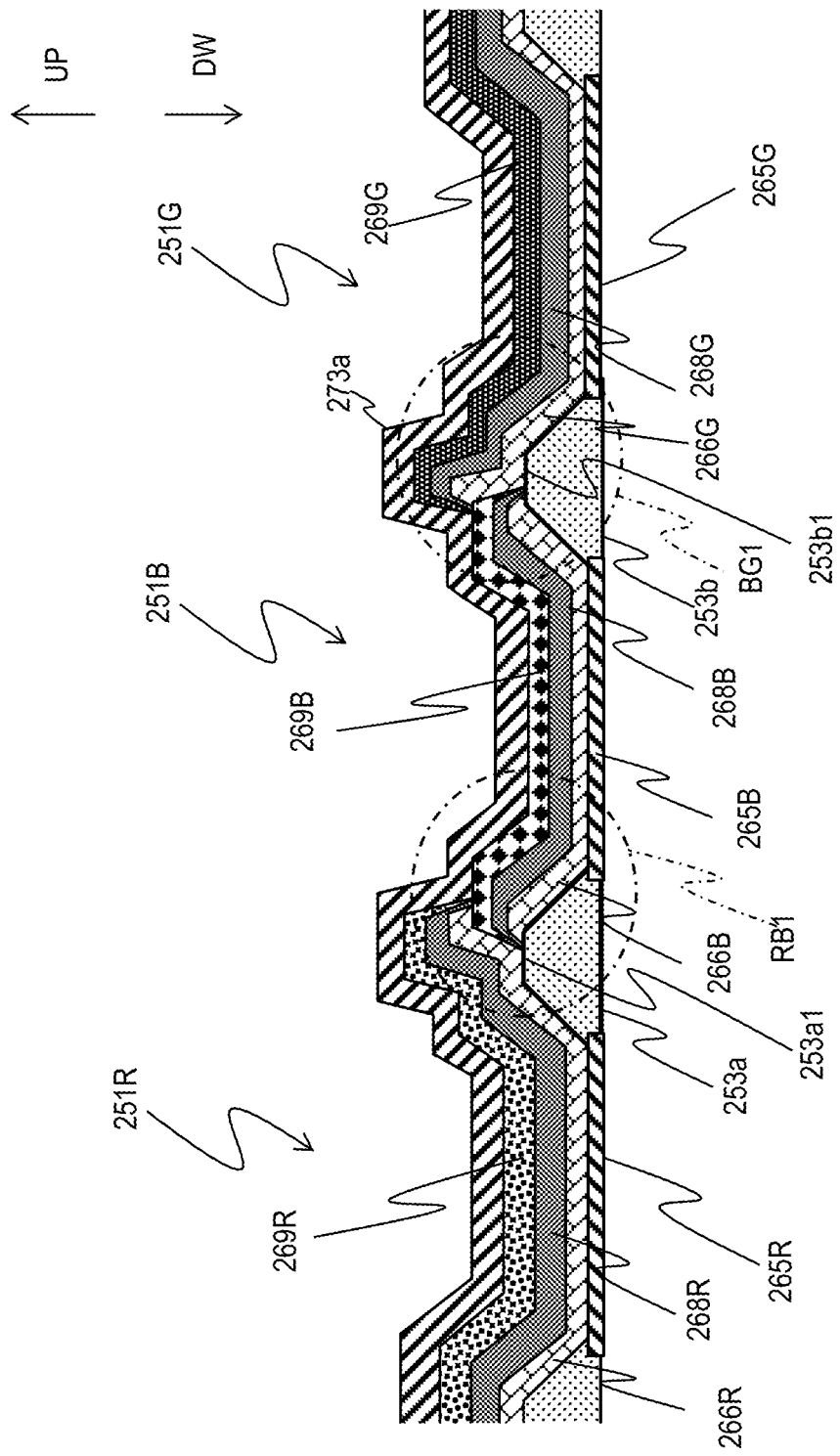
FIG. 18 is the first cross-sectional view taken along the XVIII-XVIII line in FIG. 17.

FIG. 18 is the first cross-sectional view taken along the XVIII-XVIII line in FIG. 17. Embodiment 4 schematically describes a layer structure in which the red organic light-emitting layer 269R and the green organic light-emitting layer 269G are stacked on a layer above (upper layer of) the blue organic light-emitting layer 269B. In other words, the blue organic light-emitting layer 269B is formed in a layer below (lower layer of) the red organic light-emitting layer 269R and the green organic light-emitting layer 269G. The upper side is denoted with the arrow UP, and the lower side is denoted with the arrow DW.

For example, as indicated by the one-dot chain line circle denoted with the reference character RB1, above the top surface 253a1 of the first pixel defining portion 253a disposed between the blue subpixel 251B and the red subpixel 251R adjacent to the blue subpixel 251B, the edge portion of the blue organic light-emitting layer 269B of the blue subpixel 251B is in contact with the hole supply layer (for example, the hole injection layer 266R and the hole transport layer 268R of the red subpixel) of the red subpixel 251R.

Furthermore, as indicated by the one-dot chain line circle line denoted with the reference character BG1, above the top surface 253b1 of the second pixel defining portion 253b disposed between the blue subpixel 251B and the green subpixel 251G adjacent to the blue subpixel 251B, the edge portion of the blue organic light-emitting layer 269B of the blue subpixel 251B is in contact with the hole supply layer (for example, the hole injection layer 266G and the hole transport layer 268G of the green subpixel) of the green subpixel 251G.

When the red subpixel 251R is driven but the blue subpixel 251B (or the green subpixel 251G) is not driven, the pixel circuit (not shown in the figure) of the red subpixel 251R causes a current to flow from the anode electrode 265R and the cathode electrode 273a having a voltage that is between the threshold voltage of the red subpixel 251R and the threshold voltage of the blue subpixel 251B (will be referred to as a driving current of the red subpixel, below). With this current, the red organic light-emitting layer 269R is driven to emit light.

As indicated with the reference character RB1, the left edge of the blue organic light-emitting layer 269B is in contact with the hole injection layer 266R and the hole transport layer 268R. Therefore, even if the contact area is very small, the driving current of the red subpixel 251R can flow into the blue organic light-emitting layer 269B when the red subpixel 251R emits light. However, because the voltage of the driving current of the red subpixel 251R is smaller than the threshold voltage of the blue subpixel 251B, the blue subpixel 251B does not emit light.

This makes it possible to prevent the blue subpixel 251B from emitting light at unintended timings when the red subpixel 251R emits light. When the blue subpixel 251B is driven, and the red subpixel 251R is not to be driven, because of a large energy barrier against holes as described in FIG. 2, the holes do not move from the organic light-emitting layer to the hole supply layer almost at all. Thus, the driving current of the blue subpixel 251B does not flow into the hole injection layer 266R.

In order to form the layer structure illustrated in FIG. 18, a hole transport layer and an organic light-emitting layer are deposited using a metal mask for each color. That is, using one metal mask, the hole injection layer, the hole transport layer, and the organic light-emitting layer of the same color are deposited. See FIG. 3A for the metal mask for the red subpixels.

However, depending on the manufacturing process, the hole injection layer and the hole transport layer may be deposited in the first chamber and the organic light-emitting layer may be deposited in the second chamber differing from the first chamber. Furthermore, it is preferable to reliably cover the edge of the hole supply layer including the hole injection layer and/or the hole transport layer with the organic light-emitting layer. For those reasons, the hole supply layer and the organic light-emitting layer of the same color are deposited using two different metal masks.

Figure 19:
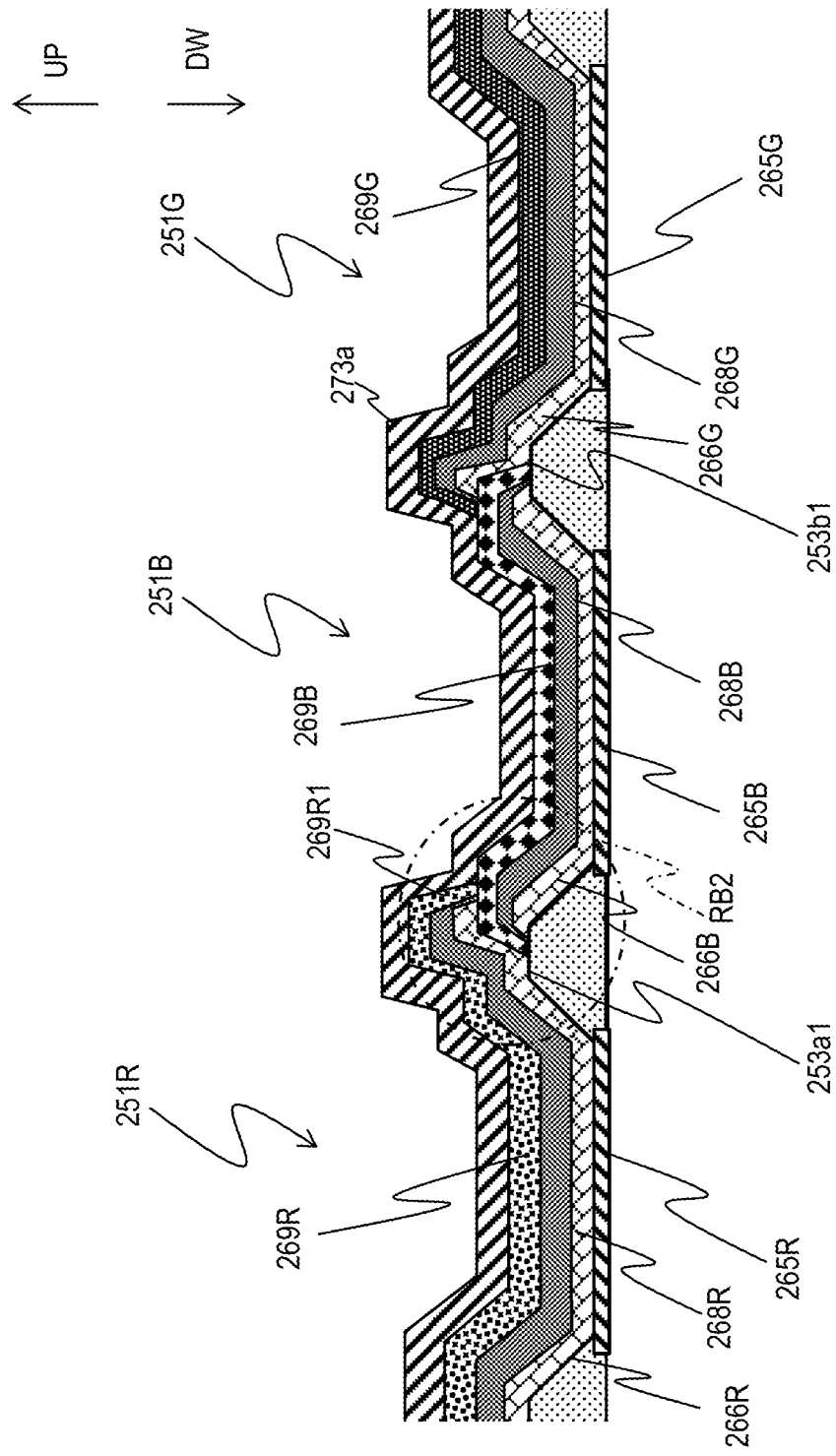
FIG. 19 is the second cross-sectional view taken along the XVIII-XVIII line in FIG. 17.

FIG. 19 is the second cross-sectional view taken along the XVIII-XVIII line in FIG. 17. FIG. 19 explains the structure to cover the edge of the hole supply layer with the organic light-emitting layer without fail. FIG. 19 schematically illustrates the layer structure in which the red organic light-emitting layer 269R and the green organic light-emitting layer 269G are stacked on a layer above (upper layer of) the blue organic light-emitting layer 269B in a manner similar to the cross-sectional view of FIG. 18. As illustrated in FIG. 19, the edge portion of the organic light-emitting layer that covers the edge of the hole transport layer completely is made thicker. For example, as indicated with the reference character RB2, the edge portion 269R1 of the red organic light-emitting layer 269R that covers the right edge of the hole transport layer 268R completely is made thicker. As described above, by increasing the thickness of the edge portion of the organic light-emitting layer, the leak path can reliably be blocked.

Figure 20:
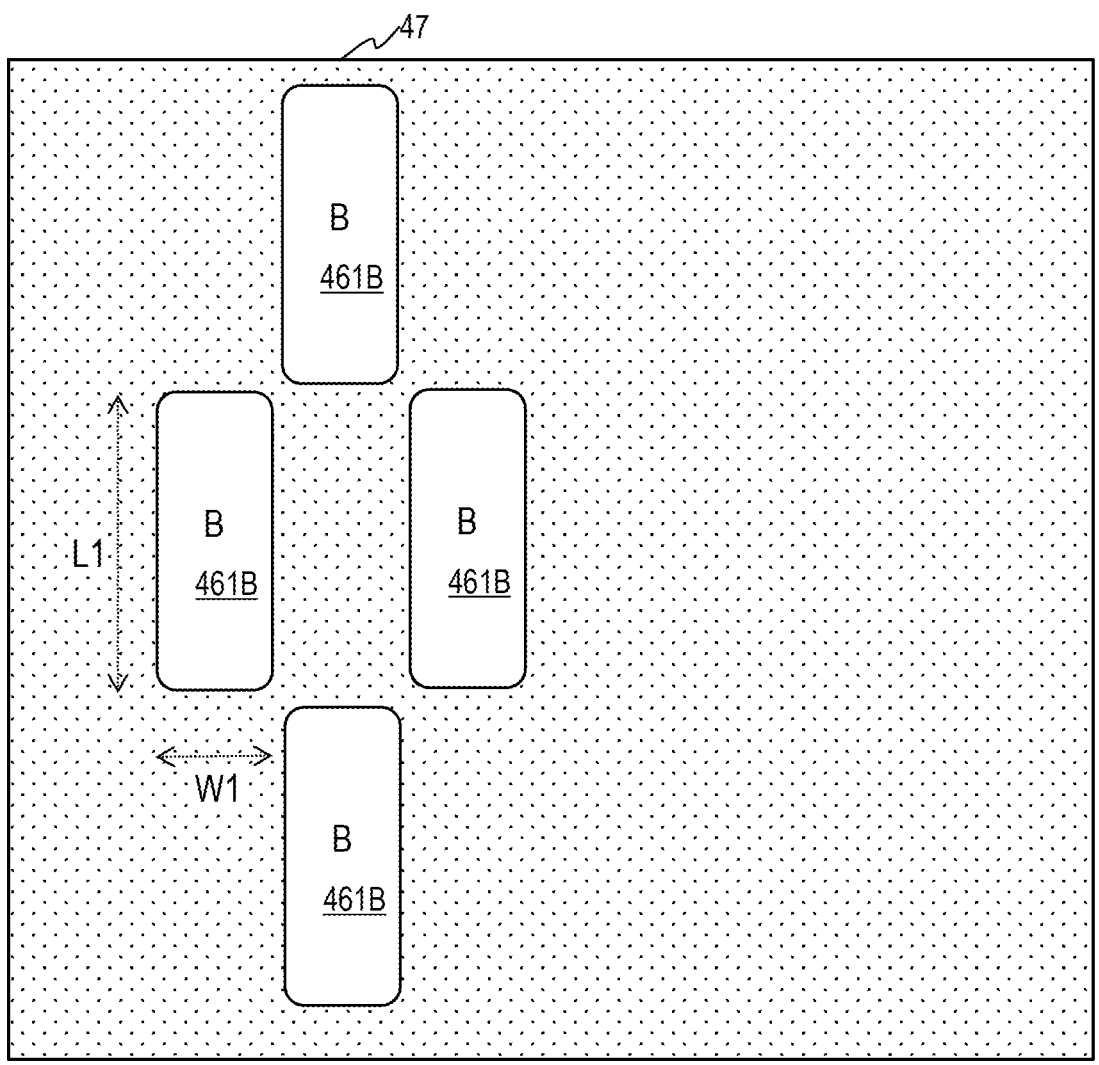
FIGS. 20 and 21 are diagrams for explaining the metal masks used to form the layer structure described with reference to the cross-sectional view of FIG. 18.
Figure 21:
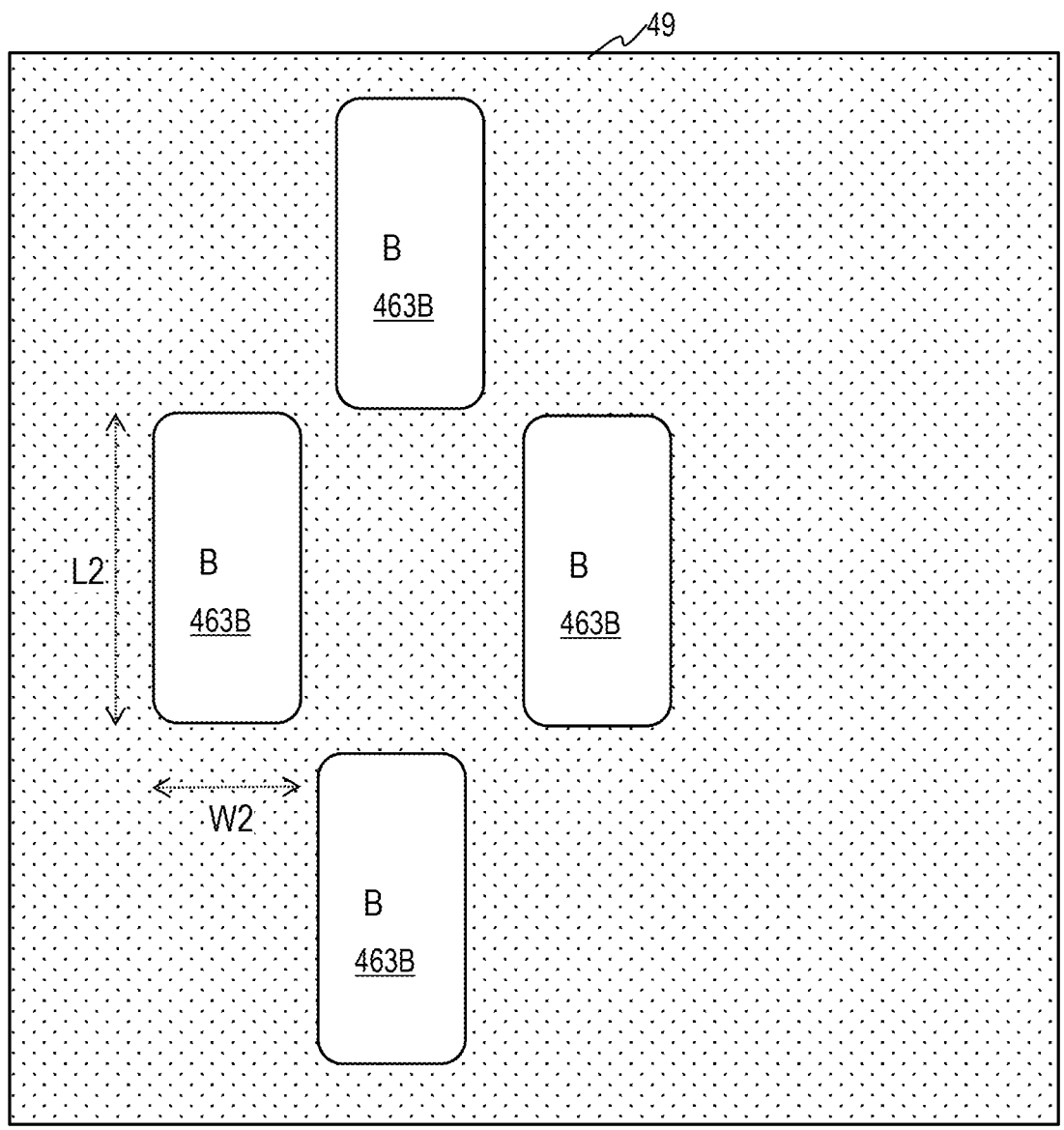

FIGS. 20 and 21 are diagrams for explaining the metal masks used to form the layer structure described with reference to the cross-sectional view of FIG. 18. The metal mask 47 of FIG. 20 is used to form the hole supply layer of blue color, for example. The metal mask 47 has openings 461B for the hole supply layer of blue subpixels. The length of the openings 461B is L1, and the width thereof is W1.

Next, the metal mask 49 of FIG. 21 is used to form the organic light-emitting layer of blue color, for example. The metal mask 49 has openings 463B for the organic light-emitting layer of blue subpixels. The length of the openings 463B is L2, which is greater than L1. The width of the openings 463B is W2, which is greater than W1.

In this manner, by making the length and width of the openings of the metal mask for the hole supply layer larger than the length and width of the openings of the metal mask for the organic light-emitting layer, the edge portion of the organic light-emitting layer covering the entire edge of the hole transport layer can be made thicker.

As explained with FIGS. 18 and 19, in the layer structure of Embodiment 4, the red organic light-emitting layer 269R and the green organic light-emitting layer 269G are stacked on a layer above (upper layer of) the blue organic light-emitting layer 269B. In order to realize this layer structure, first, the hole supply layer and the organic light-emitting layer of the blue subpixels are formed, and thereafter, the hole supply layer and the organic light-emitting layer of the red subpixels are formed.

Figure 22:
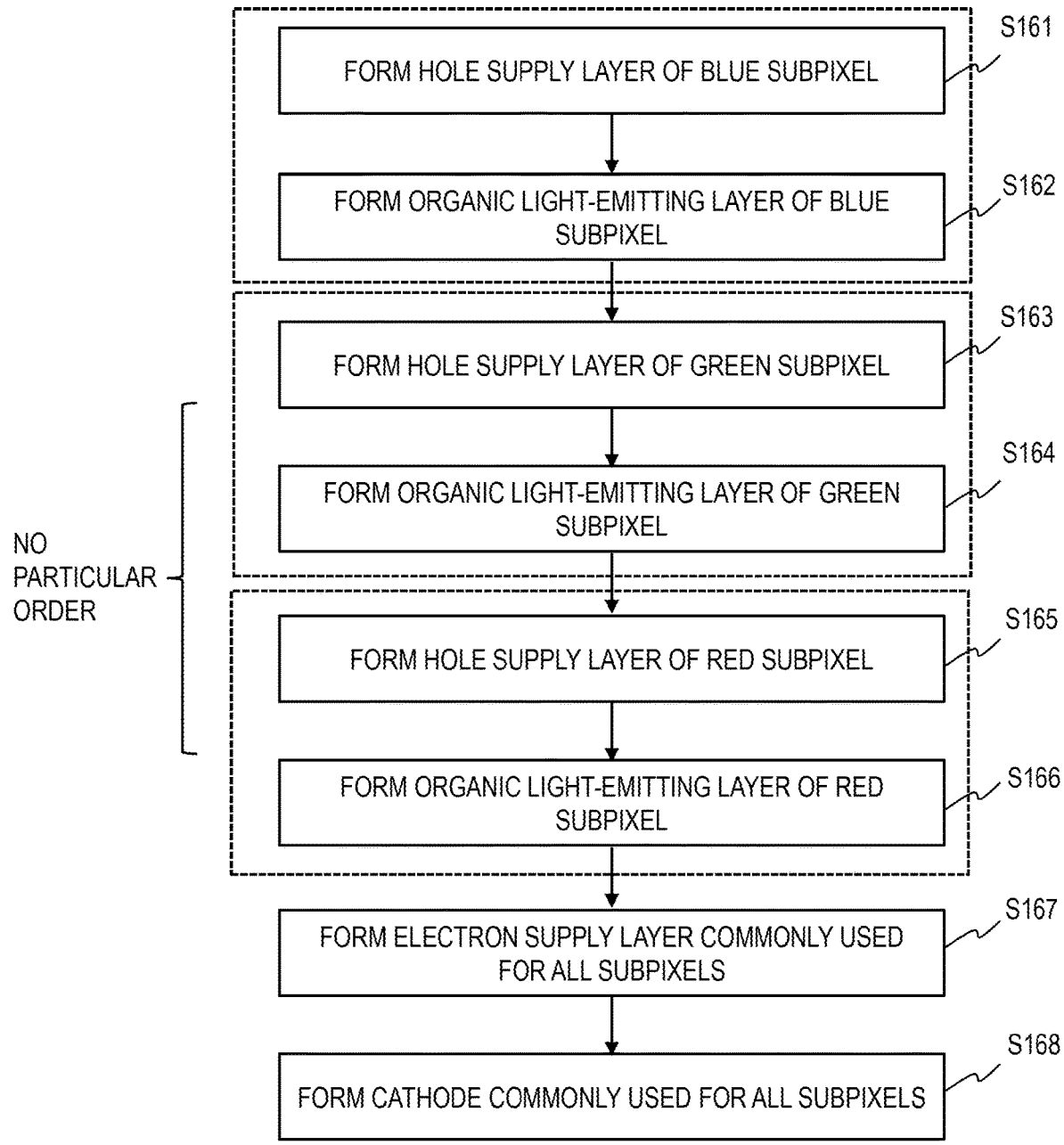
FIG. 22 is a flowchart of manufacturing process after the pixel defining layer is formed in Embodiment 4.

Below, the manufacturing process after the pixel defining layer 253 is formed in Embodiment 4 will be explained with reference to the flowchart of FIG. 22. First, the hole supply layer of blue subpixels is formed on the insulating substrate 261 on which the pixel defining layer 253 is formed (S161). Specifically, by the vapor deposition using a metal mask 47 corresponding to the pattern of the blue subpixels illustrated in FIG. 20, the material for the hole supply layer is deposited on the substrate 261 on which the pixel defining layer 253 is formed, thereby forming the hole supply layer of the blue subpixels. When the hole supply layer is constituted of a plurality of layers including the hole injection layer and hole transport layer, the film formation is repeatedly performed for the plurality of layers. The thickness of the hole supply layer can be controlled for the micro-cavity structure.

Next, the organic light-emitting layer for the blue subpixels is formed (S162). Specifically, by the vapor deposition using a metal mask 49 having a pattern corresponding to the pattern of the blue subpixels as in FIG. 21, the material for the blue organic light-emitting layer is deposited on the hole supply layer of the blue subpixels, thereby forming the blue organic light-emitting layer.

Next, the hole supply layer of green subpixels is formed on the insulating substrate 261 on which the pixel defining layer 253 is formed (S163), the organic light-emitting layer of the green subpixels is formed (S164), the hole supply layer of the red subpixels is formed (S165), the organic light-emitting layer of the red subpixels is formed (S166), the electron supply layer 271 commonly used for all subpixels is formed (S167), and on the electron supply layer 271, a metal layer for the cathode electrode 273 is deposited (S168).

Figure 5:
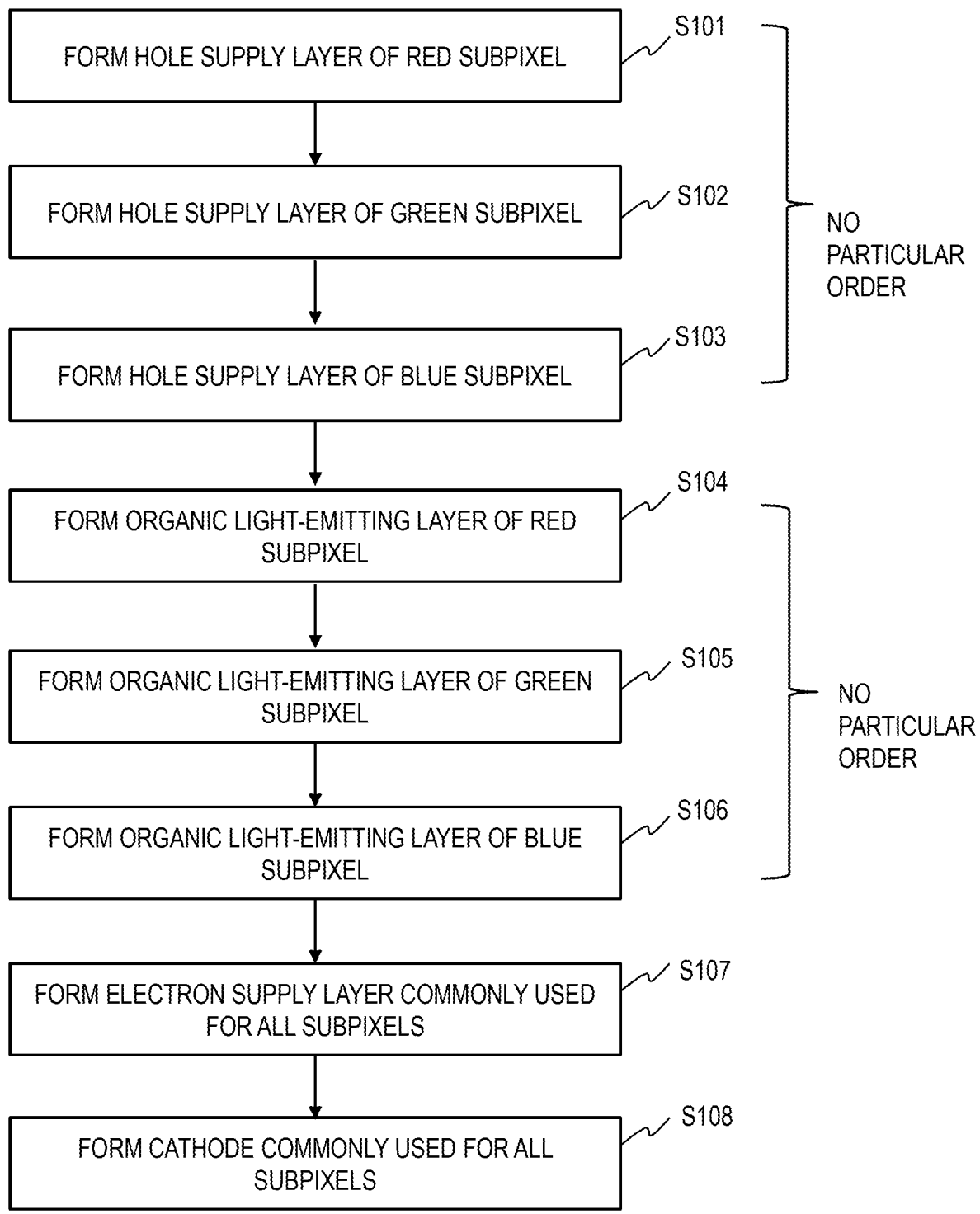
FIG. 5 is a flowchart of manufacturing process after the pixel defining layer is formed.

Details of Steps S163 to S168 were described in S102, S105, S103, S106, S107, and S108 in FIG. 5, respectively, and therefore, detailed description of those steps will not be repeated. The hole supply layer and the organic light-emitting layer of the green subpixels (S163, S164) can be formed before or after the formation of the hole supply layer and the organic light emitting layer of the red subpixels (S165, S166) (no particular order).

As described above, in Embodiment 4, the organic layers of the respective colors are stacked taking into consideration the light emission threshold voltage of each color, and therefore, even if the light-emitting layers of different colors overlap, the degradation of image quality due to crosstalk between the subpixels can be prevented more effectively.

The display region 125 described in each of the embodiments above has the top emission type pixel structure. In the pixel structure of the top-emission type, the cathode electrode 273 commonly used for a plurality of pixels is disposed at the light emission side (upper side on the diagram). The cathode electrode 273 has a shape that can completely cover the entire surface of the display region 125. The features of the present disclosure can be applied to the OLED display device having the bottom emission type pixel structure. The bottom emission type pixel structure has a transparent anode electrode and a reflective cathode electrode, and emits light to the outside through the TFT substrate 100.

The pixel array of the display region 125 described in each of the embodiments above is the stripe arrangement in which subpixel rows of three colors are cyclically arranged. The features of the present disclosure can be applied to a pixel arrangement constituted of pixel rows including subpixels of different colors, and can be applied to various pixel arrangements such as mosaic arrangement and pentile arrangement.

As set forth above, embodiments of the present disclosure have been described; however, the present disclosure is not limited to the foregoing embodiments. Those skilled in the art can easily modify, add, or convert each element in the foregoing embodiment within the scope of the present disclosure. A part of the configuration of one embodiment may be replaced with a configuration of another embodiment or a configuration of an embodiment may be incorporated into a configuration of another embodiment.

What is claimed is:

1. An OLED display device, comprising:
   a plurality of subpixels arranged on a surface of a substrate; and
   a pixel defining layer surrounding a light-emitting region of each of the plurality of subpixels,
   wherein each of the plurality of subpixels includes:
   an upper electrode,
   a lower electrode,
   an organic light-emitting layer sandwiched between the upper electrode and the lower electrode, and
   a lower carrier supply layer sandwiched between the lower electrode and the organic light-emitting layer, the lower carrier supply layer being configured to:
   make contact with the lower electrode and the organic light-emitting layer, respectively,
   supply carriers from the lower electrode to the organic light-emitting layer,
   cover the lower electrode entirely in an opening of the pixel defining layer, and
   have an edge at a top surface of the pixel defining layer surrounding the lower electrode,
   wherein the organic light-emitting layer covers an entire surface of the lower carrier supply layer including the edge of the lower carrier supply layer,
   wherein the organic light-emitting layer and the lower carrier supply layer have tapered shapes on the top surface of the pixel defining layer, and
   wherein a taper angle of the tapered shapes in a direction along which subpixels of different colors of the plurality of subpixels are arranged is steeper than a taper angle of the tapered shapes in a direction along which subpixels of a same color of the plurality of subpixels are arranged.

2. The OLED display device according to claim 1, wherein said edge of the lower carrier supply layer is separated from a lower carrier supply layer of an adjacent subpixel of a different color in an in-plane direction of the substrate, and
   wherein an edge portion of the organic light-emitting layer is located between said edge of the lower carrier supply layer and the lower carrier supply layer of the adjacent subpixel of a different color.

3. The OLED display device according to claim 2, further comprising an upper carrier supply layer commonly used for the plurality of subpixels, the upper carrier supply layer being sandwiched between respective organic light-emitting layers of the plurality of subpixels and respective upper electrodes of the plurality of subpixels so as to make contact with the organic light-emitting layers and the upper electrodes, wherein the respective upper electrodes of the plurality of subpixels are part of one common upper electrode layer, and wherein the edge portion of each organic light-emitting layer of the plurality of subpixels is located between said edge of the lower carrier supply layer and the upper carrier supply layer on the top surface of the pixel defining layer.

4. The OLED display device according to claim 1, further comprising an upper carrier supply layer commonly used for the plurality of subpixels, the upper carrier supply layer being sandwiched between respective organic light-emitting layers of the plurality of subpixels and respective upper electrodes of the plurality of subpixels so as to make contact with the organic light-emitting layers and the upper electrodes, wherein the respective upper electrodes of the plurality of subpixels are each a cathode electrode, and part of one common cathode electrode layer, wherein the upper carrier supply layer is an electron supply layer, wherein the lower electrode is an anode electrode, and wherein the lower carrier supply layer is a hole supply layer.

5. The OLED display device according to claim 1, wherein at least three subpixels are configured to emit a first color, a second color and a third color respectively, wherein an organic light-emitting layer of the subpixel of the first color covers an entire surface of a lower carrier supply layer of the subpixel of the first color including said edge, wherein an edge portion of the organic light- emitting layer of the subpixel of the first color makes contact with a lower carrier supply layer of the subpixel of the second color above a top surface of a first pixel defining part disposed between the subpixel of the first color and the subpixel of the second color that is adjacent to the subpixel of the first color, and wherein a light-emitting threshold voltage of the subpixel of the first color is higher than a light-emitting threshold voltage of the subpixel of the second color.

6. The OLED display device according to claim 1, wherein the lower carrier supply layers of subpixels of different colors have different thicknesses.

7. An OLED display device, comprising:

a plurality of subpixels arranged on a surface of a substrate; and a pixel defining layer surrounding a light-emitting region of each of the plurality of subpixels, wherein each of the plurality of subpixels includes:

an upper electrode, a lower electrode, an organic light-emitting layer sandwiched between the upper electrode and the lower electrode, and a lower carrier supply layer sandwiched between the lower electrode and the organic light-emitting layer, the lower carrier supply layer being configured to:

make contact with the lower electrode and the organic light-emitting layer, respectively, supply carriers from the lower electrode to the organic light-emitting layer, cover the lower electrode entirely in an opening of the pixel defining layer, and have an edge at a top surface of the pixel defining layer surrounding the lower electrode, wherein the organic light-emitting layer covers an entire surface of the lower carrier supply layer including the edge of the lower carrier supply layer, wherein a first edge portion of the lower carrier supply layer including said edge overlaps a second edge portion of a lower carrier supply layer of an adjacent subpixel of a different color on the top surface of the pixel defining layer, and wherein a part of the organic light-emitting layer is sandwiched between the first edge portion and the second edge portion so that the first edge portion does not make contact with the second edge portion.

8. An OLED display device, comprising:

a plurality of subpixels arranged on a surface of a substrate; and a pixel defining layer surrounding a light-emitting region of each of the plurality of subpixels, wherein each of the plurality of subpixels includes:

an upper electrode, a lower electrode, an organic light-emitting layer sandwiched between the upper electrode and the lower electrode, and a lower carrier supply layer sandwiched between the lower electrode and the organic light-emitting layer, the lower carrier supply layer being configured to:

make contact with the lower electrode and the organic light-emitting layer, respectively, supply carriers from the lower electrode to the organic light-emitting layer, cover the lower electrode entirely in an opening of the pixel defining layer, and have an edge at a top surface of the pixel defining layer surrounding the lower electrode, wherein the organic light-emitting layer covers an entire surface of the lower carrier supply layer including the edge of the lower carrier supply layer, wherein at least three subpixels are configured to emit a first color, a second color, and a third color, respectively, wherein an organic light-emitting layer of the subpixel of the first color covers an entire surface of a lower carrier supply layer of the subpixel of the first color including said edge, wherein an edge portion of the organic light- emitting layer of the subpixel of the first color makes contact with a lower carrier supply layer of the subpixel of the second color above a top surface of a first pixel defining part disposed between the subpixel of the first color and the subpixel of the second color that is adjacent to the subpixel of the first color, and wherein a light-emitting threshold voltage of the subpixel of the first color is higher than a light-emitting threshold voltage of the subpixel of the second color.

9. The OLED display device according to claim 8, wherein an edge portion of the organic light-emitting layer of the subpixel of the first color makes contact with a lower carrier supply layer of the subpixel of the third color above a top surface of a second pixel defining part disposed between the subpixel of the first color and the subpixel of the third color that is adjacent to the subpixel of the first color, and wherein a light-emitting threshold voltage of the subpixel of the first color is higher than a light-emitting threshold voltage of the subpixel of the third color.

10. The OLED display device according to claim 9,
wherein the plurality of subpixels are arranged in a matrix,
   wherein the subpixels of the second color are adjacent to the subpixel of the first color in both row and column directions, and
   wherein the subpixels of the third color are adjacent to the subpixel of the first color in both row and column directions.

* * * * *